US008218705B2

(12) United States Patent
Yousefi Moghaddam et al.

(10) Patent No.: US 8,218,705 B2
(45) Date of Patent: Jul. 10, 2012

(54) LINEAR PHASE INTERPOLATOR AND PHASE DETECTOR

(75) Inventors: Gholamreza Yousefi Moghaddam, Ottawa (CA); Dirk Pfaff, Ottawa (CA); Sivakumar Kanesapillai, Ottawa (CA)

(73) Assignee: Diablo Technologies Inc., Ottawa (CA)

( * ) Notice: Subject to any disclaimer, the term of this patent is extended or adjusted under 35 U.S.C. 154(b) by 1121 days.

(21) Appl. No.: 12/081,380

(22) Filed: Apr. 15, 2008

(65) Prior Publication Data

US 2009/0103675 A1 Apr. 23, 2009

Related U.S. Application Data

(60) Provisional application No. 60/960,921, filed on Oct. 19, 2007.

(51) Int. Cl.
*H03D 3/24* (2006.01)
(52) U.S. Cl. ........ 375/376; 375/327; 375/359; 375/371; 375/373; 375/375; 327/141; 327/156; 327/157
(58) Field of Classification Search .......... 375/215, 375/293, 294, 295, 325–327, 354, 359, 362, 375/371, 373, 374, 375, 376
See application file for complete search history.

(56) References Cited

U.S. PATENT DOCUMENTS

| | | | |
|---|---|---|---|
| 5,475,344 A | 12/1995 | Maneatis et al. | |
| 6,005,448 A | 12/1999 | Pickering | |
| 6,466,098 B2 | 10/2002 | Pickering | |
| 7,102,401 B2* | 9/2006 | Galloway | 327/157 |
| 7,321,269 B2 | 1/2008 | Drake | |
| 7,433,442 B2* | 10/2008 | Briones | 375/375 |
| 7,508,277 B2* | 3/2009 | Kuo et al. | 331/25 |
| 7,668,277 B2* | 2/2010 | Hu | 375/373 |
| 7,940,873 B2* | 5/2011 | Tamura | 375/355 |
| 2004/0066240 A1* | 4/2004 | Staszewski et al. | 331/36 C |
| 2007/0047689 A1* | 3/2007 | Menolfi et al. | 375/376 |
| 2007/0258491 A1 | 11/2007 | Reitlingshoefer | |
| 2008/0100354 A1* | 5/2008 | Lee | 327/158 |
| 2011/0204937 A1* | 8/2011 | Demirkan | 327/157 |

OTHER PUBLICATIONS

B. Ganesh et al., "Fully-Buffered DIMM Memory Architectures: Understanding, Mechanisms, Overhead and Scalings", IEEE Int. Symp. on High Performance Computer Architecture, pp. 109-120, Feb. 2007.
Intel Corporation, "Intel 6400/6402 Advanced Memory Buffer Datasheet", pp. 38-42, Oct. 2006.
H. Partovi et. al, "Data Recovery and Retiming for the Fully Buffered DIMM 4.8Gb/s Serial Links", ISSCC Dig. Tech. Papers, pp. 336-337, Feb. 2006.
"FB-DIMM High Speed Differential PTP Link at 1.5V—Specification", JEDEC, Sep. 2006, and Dec. 2005.
T. Toifl et al., "A 0.94-ps-RMS-jitter 0.016-mm2 2.5-GHz multiphase generator PLL with 360° digitally programmable phase shift for 10-Gb/s serial links", IEEE J. of Solid State Circuits, vol. 40, pp. 2700-2712, Dec. 2005.

(Continued)

Primary Examiner — Hirdepal Singh

(57) ABSTRACT

A novel interpolating phase detector for use in a multiphase PLL is described comprising an array of individual phase comparators, all operating at essentially the same operating point which permits the circuits to be designed simultaneously for high speed and for low power consumption. Two adjacent phase outputs of a multi-phase VCO may be selected and interpolated in between, by selectively attaching a variable number of phase comparators to each phase output and summing their phase error outputs. By varying the number of phase comparators attached to each phase output, interpolation can be achieved with high linearity.

25 Claims, 10 Drawing Sheets

OTHER PUBLICATIONS

Yalcin Alper Eken, Student Member, IEEE, and John P. Uyemura, Senior Member, IEEE, "A 5.9-GHz Voltage-Controlled Ring Oscillator in 0.18-um CMOS," in IEEE journal of solid-state circuits, vol. 39, No. 1, Jan. 2004, pp. 230-233.

Edoardo Prete, Dirk Scheideler, Anthony Sanders, "A 100mW 9.6Gb/s Transceiver in 90nm CMOS for next-generation memory interfaces," Infineon, Munich, Germany, ISSCC 2006 / Session 4 / Gigabit Transceivers / 4.5.

D.-Y. Jeong, S.-H. Chai, W.-C. Song, and G.-H. Cho, "CMOS current-controlled oscillators using multiple-feedback loop architectures," in IEEE Int. Solid-State Circuits Conf. Dig. Tech. Papers, 1997, pp. 386-387.

* cited by examiner

LINEAR PHASE INTERPOLATOR AND PHASE DETECTOR

RELATED APPLICATIONS

The present application claims priority from the U.S. provisional application Ser. No. 60/960,921 entitled "A Voltage Controlled Oscillator (VCO) and a Linear Phase Interpolator/Phase Detector Combination, and a Multi-Phase Clock Generator Using the Same" filed on Oct. 19, 2007, which is incorporated herein by reference.

FIELD OF THE INVENTION

The present invention generally relates to clock regeneration for serial links in electronic equipment, specifically phase-adjustable phase lock loops (PPLs).

BACKGROUND OF THE INVENTION

Bandwidth and capacity of memory systems based on commodity dual-inline memory modules (DIMM) are severely limited by the parallel stub bus between the modules and the memory controller. In order to maintain signal integrity, the maximum number of DIMMs per channel had to be reduced with the market entrance of every new dynamic random access memory (DRAM) generation. Fully buffered DIMMs (FBDIMM) eliminate this limitation by replacing the parallel stub bus by serial, point-to-point links with a repeater device (an advanced memory buffer (AMB)) residing on every FBDIMM. While solving the bandwidth-capacity problem, FBDIMM systems potentially increase the memory latency. Keeping the pass-through latency below 3 ns, combined with careful command sequencing may alleviate the latency problem, as described in B. Ganesh et al., "Fully-Buffered DIMM Memory Architectures: Understanding, Mechanisms, Overhead and Scalings", IEEE Int. Symp. On High Performance Computer Architecture, pp. 109-120, February 2007. The main barrier for the wide acceptance of FBDIMM however, remains the high power consumption of the AMB. Current AMBs tend to consume more than 8W, see, for example, Intel Corporation, "Intel 6400/6402 Advanced Memory Buffer Datasheet", pp. 38-42, December 2006, with the high speed serial links alone dissipating 4W, see H. Partovi et. al, "Data Recovery and Retiming for the Fully Buffered DIMM 4.8 Gb/s Serial Links", ISSCC Dig. Tech. Papers, pp. 336-337, February 2006. A significant reduction of AMB power consumption, and most importantly its high speed serial links delivering a combined bit-rate of up to 115 Gb/s, remain a critical undertaking in the design of high bandwidth and high capacity memory systems.

Requirements for FBDIMMs are described in detail in "FB-DIMM High Speed Differential PTP Link at 1.5V—Specification", JEDEC, December 2005.

In this specification, a memory architecture is described which is based on very high speed serial links joining fully buffered DIMMs (FBDs) in a daisy chain arrangement to a host as illustrated in FIG. 1.

The basic functionality of an AMB is also described in more detail in the U.S. patent application Ser. No. 11/790,707 filed Apr. 27, 2007 entitled "PROGRAMMABLE ASYNCHRONOUS FIRST-IN-FIRST-OUT (FIFO) STRUCTURE WITH MERGING CAPABILITY", which is incorporated herein by reference.

For the convenience of the reader, FIG. 1 from this patent application is reproduced here.

FIG. 1 shows a memory system 100 of the prior art, comprising a host 102 connected to a first FBDIMM 104 over serial links 106. If the memory system contains more than one FBDIMM (as shown in FIG. 1), the first FBDIMM 104 is connected to a second FDB 108 over serial links 110. Additional FBDIMMs may be chained with serial links 112 in a daisy chain fashion, until a last FBDIMM 114 is reached. A clock buffer 116 distributes a reference clock signal to the host 102 and each of the FBDIMMs (104, 108, ..., 114), over clock reference links 118. Each of the FBDIMMs (104, 108, ..., 114) may include one or more memory devices (DRAMs 120) and an advanced memory buffer (AMB) 122.

Each of the serial links (106, 110, ..., 112) comprises multiple upstream channels 124 (carrying formatted data frames towards the host 102) and downstream channels 126 (carrying formatted data frames and control information towards the last FBDIMM 114). The "channels" are also referred to as "lanes" or "bit lanes" indicating that each data frame is transmitted in multiple time slots bit-serially, and striped across the lanes of a link, a technique commonly employed in a number of high speed transmission protocols.

Writing of memory data is accomplished by transmitting the formatted frames over the downstream channels 126 of the serial links (106, 110, ..., 112), from the host 102 through one or more AMBs 122 to the memory device (DRAM) 120 that is addressed. Reading of memory data is similarly accomplished by sending a read request from the host 102 through one or more AMBs 122 to the addressed memory device (DRAM) 120 over the downstream channels 126, and subsequently transmitting the memory data from the addressed memory device (DRAM) 120 through one or more AMBs 122 over the upstream channels 124 to the host 102.

It will be appreciated that the host 102 may communicate with a DRAM 120 on any FBDIMM, including the last FBDIMM 114, thus transmitting through a number of AMBs 122 in series. The required functions of the AMB 122 are described in the aforementioned JEDEC specification. They include retrieving and regenerating the serial downstream channels 126 to the next AMB 122 in the daisy chain;

retrieving and regenerating the serial bit streams upstream to the previous AMB 122 in the daisy chain, or to the host 102 as required;

converting received downstream data to parallel for interfacing to the DRAMs 120 located on the same FBDIMM;

converting parallel data from the DRAMs 120 located on the same FBDIMM, to serial format for transmitting upstream; and merging the data from the DRAMs 120 located on the same FBDIMM, with the serial data received on the upstream channels 124 from other FBDIMMs (located further downstream), for transmission on the upstream channels 124 toward the host 102.

Given the high speed nature of the serial links, which may be running at a bit rate of 4.8 Gbit/s each, the physical constraints of signal transmission between devices, and the delays and variations within the devices themselves, one must expect skew between the bit lanes of each link and the reference clock 118. In addition jitter and wander occurs. To combat these effects the design of the AMB 122 must include high speed clock alignment circuitry (to align the data edges of each lane with the reference clock) and First-In-First-Out (FIFO) buffers to continuously absorb jitter and wander dynamically.

An approach for aligning the data edges of each lane with the reference clock 118 in the AMB 122, is to generate a separate clock for each lane, each separate clock being frequency aligned with the reference clock, but phase aligned with the data received on each respective lane. Implementations of an approach for generating phase aligned clocks, including a phase locked loop with adjustable phase shift, are described in U.S. patent application Ser. No. 11/216,952 filed on Aug. 31, 2005, Us publication number 20070047689, entitled "Phase locked loop apparatus with adjustable phase shift", Menolfi et al. The phase locked loop (PLL) apparatus with adjustable phase shift of Menolfi includes a voltage controlled oscillator (VCO) configured to generate multiple phase shifted output signals for sampling the serial data stream, and multiple phase detectors for determining the phase difference between the VCO and a selected phase of a reference clock. The phase is selected by enabling two of the phase detectors which are connected to two phases of the reference clock that differ by 45 degrees, and summing the outputs of the phase detectors. An intermediate phase can then be selected by varying the strength of each of the two phase detectors using two digital to analog converters that supply the operating currents of the two phase detectors, as described in the cited patent application of Menolfi.

While Menolfi teaches a PLL with adjustable phase shift that could be embedded in the AMB 122 for aligning the data edges of each lane with the reference clock 118, the circuit includes features that may not be required in the AMB 122. At the same time, the circuit consumes more power considering that multiple PLLs for a large number, i.e. up to 24, of serial bit lanes are required, and it may not provide sufficient linearity in its phase control. The high power consumption of the circuit of Menolfi is due to technology constraints in providing high enough operating speed in the phase detectors over the range of currents of the digital to analog converters. Linearity of phase interpolation requires the two active digital to analog converters to be well matched at combinations of settings; linearity may also be affected by the change in current density in the phase detectors, where the current density varies over a large range and is dependent on the phase interpolator setting.

Because of these deficiencies, the PLL with adjustable phase shift according to Menolfi may not be suited for implementing a phase-adjustable PLL for use in the AMB.

Consequently a new and improved PLL with adjustable phase shift needs to be developed to overcome the disadvantages of the prior art.

SUMMARY OF THE INVENTION

There is an object of the present invention to provide an improved linear phase interpolator and phase detector.

According to one aspect of the invention, there is provided an interpolating phase detector array for comparing a phase of a reference clock signal with phases of a set of K phase shifted clock signals and generating a phase error output signal, the interpolating phase detector array comprising:
  a plurality of N phase detector columns, each column including:
    a plurality of M exclusive-OR (XOR) blocks, each block having:
      inputs for receiving the reference clock signal, receiving two of the phase shifted clock signals, receiving "coarse" control signals for enabling said received phase shifted clock signals; and
      a phase error output;
    a steerable current source having first and second current sink outputs for delivering a bias current to two distinct sets of XOR blocks, and having an input to receive a "fine" control signal for directing the bias current to one of said distinct sets; and
    a current output IOUT for delivering the phase error output signal formed by joining phase error outputs of the XOR blocks.

The received phase shifted clock signals are selected from the set of K phase shifted clock signals to have phases differing by 180 degrees. Each of the received phase shifted clock signals is connected to one of the XOR-blocks in each phase detector column.

Beneficially, all N steerable current sources are designed to deliver substantially the same unit strength of the bias current. Alternatively, N−1 steerable current sources may be designed to deliver substantially the same unit strength of the bias current, and one steerable current source is designed to deliver the bias current with a strength of ½ unit.

In the embodiment of the invention, M=4, K=8, and N=9.

According to another aspect of the invention there is provided a interpolating phase detector array for comparing a phase of a reference clock signal with phases of a set of K phase shifted clock signals and generating a phase error output signal, the phase detector array comprising:
  a matrix of M rows by N columns of exclusive-OR (XOR) blocks, and a set of N steerable current sources;
  each of the XOR blocks including a reference clock input connected to the reference clock signal, further including first and second phase shifted clock inputs connected to selected ones of the set of phase shifted clock signals, a bias current input, and a phase error output, the phase error outputs of all XOR blocks being joined into a current output IOUT for delivering the phase error output signal; and
  each of the N steerable current sources being assigned to a distinct one of the columns of the XOR-blocks, each steerable current source including a first current sink output connected to the bias current inputs of the XOR-blocks of odd-numbered rows, and second current sink outputs connected to the bias current inputs of the XOR-blocks of even-numbered rows.

In the interpolating phase detector array described above, each XOR block further includes first and second "coarse" control inputs for enabling corresponding first and second phase shifted clock inputs, and wherein each steerable current source further includes a "fine" control input for steering the bias current to either the first or second current sink outputs.

Advantageously, all N steerable current sources are designed to deliver substantially the same unit strength of the bias current. Alternatively, N−1 steerable current sources are designed to deliver substantially the same unit strength of the bias current, and one steerable current source is designed to deliver the bias current with a strength of ½ unit. In the embodiment of the invention, M=4, K=8 and N=9.

According to one more aspect of the invention there is provided a method for detecting a phase error in an interpolating phase detector array, including the steps of:
  providing an array of XOR blocks arranged in M rows and N columns for comparing a phase of a reference clock signal with phases of a set of K phase shifted clock signals;
  enabling a first subset of the XOR blocks in one of the M rows to perform the comparison with the phase of a first one of the K phase shifted clock signals, under control of a first "coarse" control signal;
  enabling a second subset of the XOR blocks in a different one of the M rows to perform the comparison with the phase of a second one of the K phase shifted clock signals, under control of a second "coarse" control signal, the phase of the second phase shifted clock signal differing from the phase of the first phase shifted clock signal by approximately 360/K degrees;

providing each enabled XOR block with a bias current of unit strength; and generating a phase error output signal by combining comparison outputs from all enabled XOR blocks.

In the method described above, the step of providing each enabled XOR block with a bias current includes steering the bias current from one of N steerable current sources individually assigned to a column to XOR blocks in the column in odd-numbered and even-numbered rows respectively, dependent on the state of a "fine" control signal applied to the steerable current source.

The method further comprises the step of selecting a combination of states of the N "fine" control signals to steer the bias current to a first and second subsets of the XOR blocks in the odd-numbered and even-numbered rows respectively.

The method further comprises the step of combining the phase error outputs from the enabled XOR blocks of the each subset yielding a combined phase error output current of a strength in proportion to a size of the respective subset.

According to yet one more aspect of the invention, there is provided a phase lock loop (PLL) including a multiphase voltage controlled oscillator (VCO) generating a set of K phase shifted clock signals whose frequency is controlled through a frequency control input, and an interpolating phase detector array designed for comparing a phase of a reference clock signal with phases of the phase shifted clock signals and for generating a phase error output signal, the interpolating phase detector array comprising:

a plurality of N phase detector columns, each phase detector column including:

a plurality of M exclusive-OR (XOR) blocks, each having inputs for receiving the reference clock signal, receiving two of the phase shifted clock signals, receiving "coarse" control signals for enabling said received phase shifted clock signals, and having a phase error output; and a steerable current source having first and second current sink outputs for delivering a bias current to two distinct sets of XOR blocks, and having an input to receive a "fine" control signal for directing the bias current to one of said distinct sets; and the phase error outputs of all XOR blocks being joined into a current output IOUT for delivering the phase error output signal.

The PLL further comprises a current to voltage converter coupled to the current output IOUT, for converting the phase error output current IOUT into a voltage phase error voltage SEC coupled to the frequency control input of the VCO. Each of the received phase shifted clock signals is connected to one of the XOR blocks in each phase detector column. Beneficially, all N steerable current sources are designed to deliver substantially the same unit strength of the bias current. Alternatively, N−1 steerable current sources are designed to deliver substantially the same unit strength of the bias current, and one steerable current source is designed to deliver the bias current with a strength of ½ unit. In the embodiment of the invention, M=4, K=8, and N=9.

BRIEF DESCRIPTION OF THE DRAWINGS

Embodiments of the invention will now be described, by way of example, with reference to the accompanying drawings in which.

DETAILED DESCRIPTION OF THE EMBODIMENTS OF THE INVENTION

In order to overcome the disadvantages of the prior art, a phase adjustable phase locked loop (PLL) is proposed, which incorporates a novel combined phase interpolator/phase detector with inherently good linearity and with power consumption reduced by a factor of 5 to 10, compared to the prior art. The lower power consumption is achieved by a novel circuit configuration in combination with certain opportunities available in the technology as will become clear in the detailed description which follows. The configuration is also designed to automatically provide very good linearity without requiring a technology level exceeding that generally required in the implementation of an advanced memory buffer (AMB).

Figure 2:
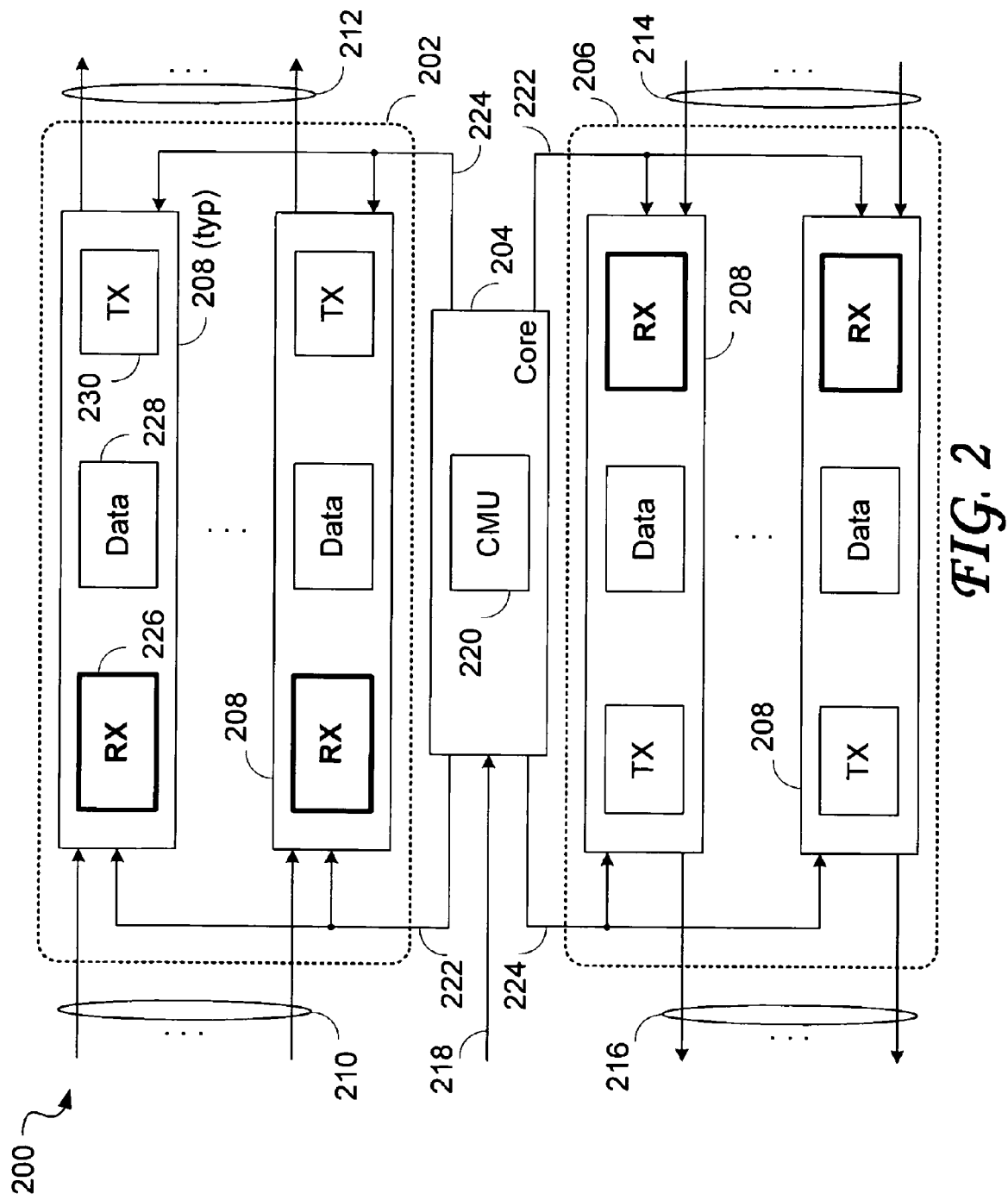
FIG. 2 shows a simplified block diagram of an AMB 200 according to an exemplary embodiment of the invention.

FIG. 2 shows a simplified block diagram of an AMB 200 according to an exemplary embodiment of the invention.

The AMB 200 comprises a first group 202 of downstream transceivers, a core 204, and a second group 206 of upstream transceivers. In the preferred embodiment, each of a total of twenty four (24) transceivers, i.e. 14 downstream and 10 upstream transceivers, is implemented in the form of a unidirectional transceiver 208.

Figure 1:
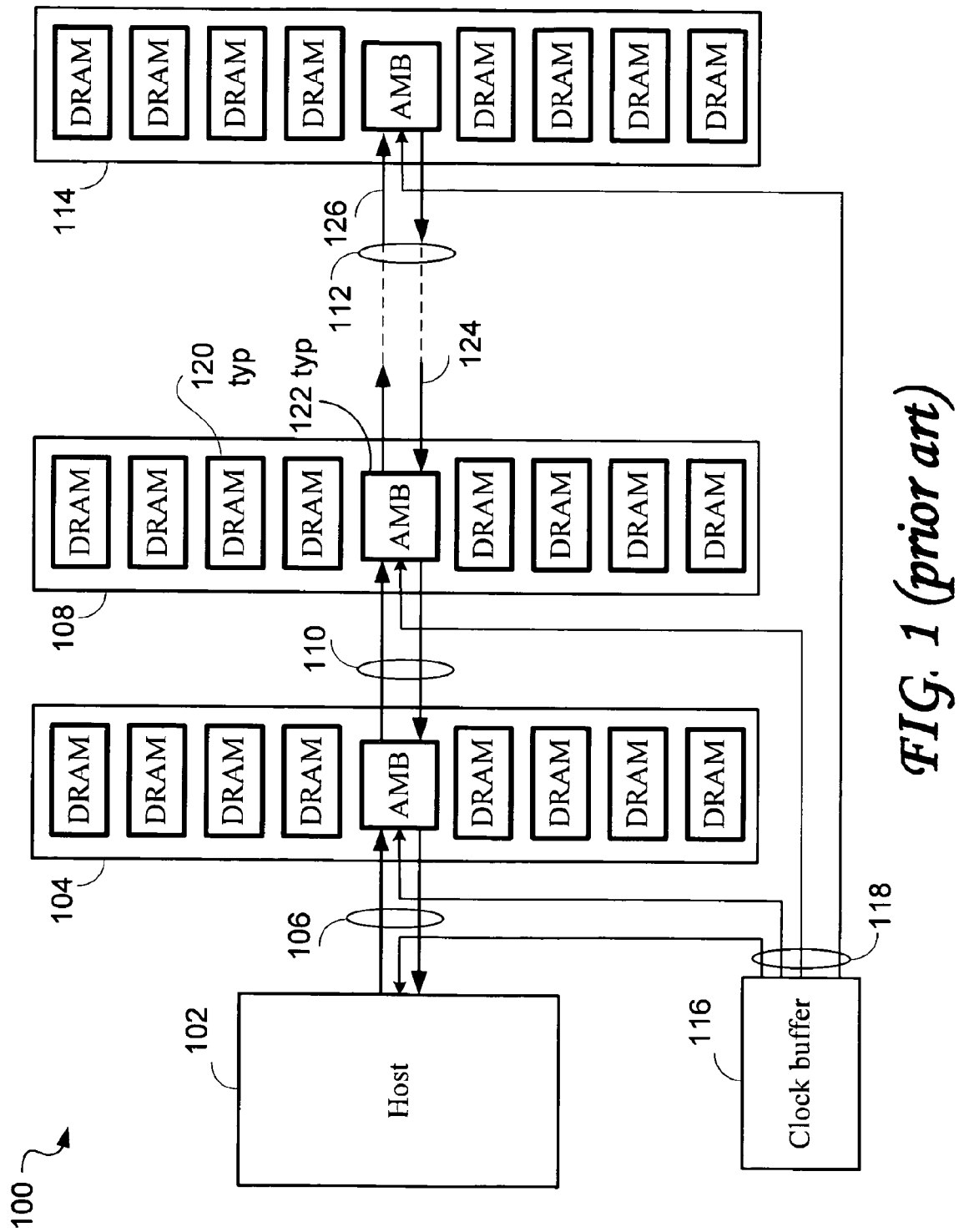
FIG. 1 shows a memory system 100 of the prior art.

In a memory system (for example, the memory system 100 of FIG. 1), the group 202 of downstream transceivers is connected through downstream receive links 210 to a host or an upstream AMB, and may be further connected through downstream transmit links 212 to a downstream AMB. Similarly, the group 206 of upstream transceivers may be connected through upstream receive links 214 to a downstream AMB, and is further connected through upstream transmit links 216 to a host or an upstream AMB.

The core 202 terminates a common clock reference link 218 which may carry a sub rate clock signal from the memory system clock buffer 116 (FIG. 1) to the AMB 200. The core 202 includes a clock multiplier unit (CMU) 220 which uses the sub rate clock signal from the clock reference link 218 to generate a receive reference clock that is fed to all transceivers 208 through a receive reference clock bus 222. Similarly, the CMU 220 generates a transmit reference clock that is fed to all transceivers 208 through a transmit reference clock bus 224. Multiple reference clock buses 222 and 224 may be employed to reduce the load on any bus and/or to facilitate chip layout. For example as illustrated in FIG. 2, separate reference clock buses 222 and 224 may be routed to the group 202 of downstream transceivers and the group 206 of upstream transceivers.

Each transceiver 208 of the group 202 of downstream transceivers and of the group 206 of upstream transceivers includes a receive circuit (RX) 226; a Data circuit 228; and a transmit circuit (TX) 230. The Data circuit 228 and the transmit circuit (TX) 230 are only shown in order to demonstrate the environment of the AMB 200, but these circuits are not within the scope of the present invention, and should not be construed to limit the invention which is embedded in the receive circuit (RX) 226.

The overall functionality of each transceiver 208 includes:
(a) receiving a serial bit stream from the corresponding downstream or upstream receive link (210 and 214 respectively);
(b) generating a local phase adjusted clock for sampling the serial bit stream;
(c) buffering the sampled data bits and forwarding them to the corresponding downstream or upstream transmit link (212 and 216 respectively); and
(d) extracting or merging the sampled data bits in the Data circuit 228.

Please refer to the United States Patent Application "Programmable Asynchronous first-in-first-out (FIFO) structure with merging capability", Ser. No. 11/790,707 cited above for more details on the overall design of the exemplary transceiver 208 (for example, "Channel Slice" 202 in FIG. 2 of the cited application).

While the block diagram of the AMB 200 is presented for illustration of an application of the present invention, it is understood that the invention may also be advantageously used in other systems that include a phase adjustable PLL.

Figure 3:
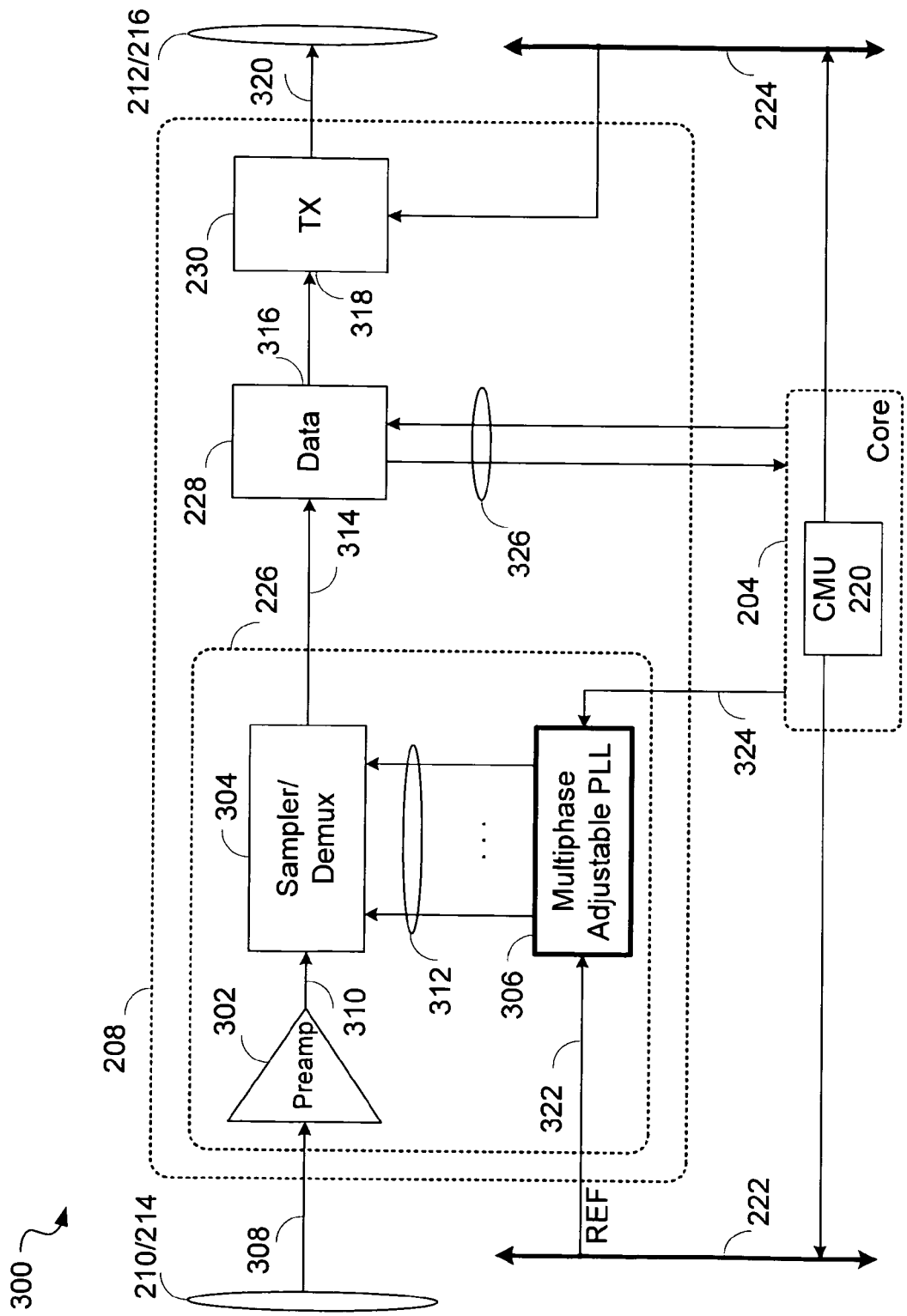
FIG. 3 shows a block diagram 300 of the core 204 and one transceiver 208 of the AMB 200 of FIG. 2.

FIG. 3 shows a block diagram 300 of an instance of the transceiver 208, connected to the core 204 which includes the CMU 220. The transceiver 208 includes the receive circuit (RX) 226, the data circuit 228, and the transmit circuit (TX) 230. The same reference numerals are used in FIGS. 2 and 3 to denote corresponding items.

The receive circuit (RX) 226 includes a Preamplifier 302, a Sampler/Demultiplexer 304, and a Multiphase Adjustable PLL 306.

The Preamplifier 302 receives a serial input signal 308 which arrives over one of the downstream receive links 210 in the case where the transceiver 208 is in the group 202 of downstream transceivers. Alternatively, the serial input signal 308 which arrives over one of the upstream receive links 214 in the case where the transceiver 208 is in the group 204 of upstream transceivers. An amplified input signal 310 from the output of the Preamplifier 302 is input to the Sampler/Demultiplexer 304 which receives a multiphase sampling clock 312 from the Multiphase Adjustable PLL 306. The multiphase sampling clock 312 comprises a number of evenly spaced phases of the clock signal to be used for sampling the amplified input signal 310 in the Sampler/Demultiplexer 304.

The output of the Sampler/Demultiplexer 304 is a multi-bit input data signal 314 that is input to the data circuit 228. A multi-bit output 316 of the data circuit 228 is connected to a multi-bit input 318 of the transmit circuit (TX) 230 which generates a serial output signal 320 that is transmitted over one of the downstream transmit links 212 in the case where the transceiver 208 is in the group 202 of downstream transceivers, or over one of the upstream transmit links 216 in the case where the transceiver 208 is in the group 204 of upstream transceivers.

The Multiphase Adjustable PLL 306 receives a reference clock (REF) 322 from the receive reference clock bus 222 and generates the multiphase sampling clock 312 that is frequency locked to the reference clock 322, but whose overall phase relative to the reference clock 322 is controlled by a phase control signal 324 that is received from the core 204.

The data circuit 228 is further connected to the core with data buses 326 over which the core 204 may receive parallel words of the received data derived from the multi-bit input data signal 314, and over which the core 204 may insert (merge) data for transmission in the upstream direction. The matters of the data circuit 228 and of the transmit circuit (TX) 230 are not directly relevant to the present invention, but are part of the reason the phases of the sampling clocks 312 of each transceiver 208 must be controlled individually.

The phase control signal 324 is a digital signal that is generated by the core 204 which by these means adjusts the phase of each of the transceivers 208 independently as required to align the sampling of the data streams, so they may be demultiplexed, buffered, processed, and merged as further described in the U.S. application Ser. No. 11/790,707 filed Apr. 27, 2007 cited above. Temporary short term phase drift of the serial input signal 308 is absorbed by a programmable first-in-first-out buffer (FIFO) in the data circuit 228. The sampled and re-timed receive data may be directly forwarded from the data circuit 228 to the transmit circuit (TX) 230 in pass-through mode, as further described in the U.S. application Ser. No. 11/790,707 filed on Apr. 27, 2007 cited above.

Figure 4:
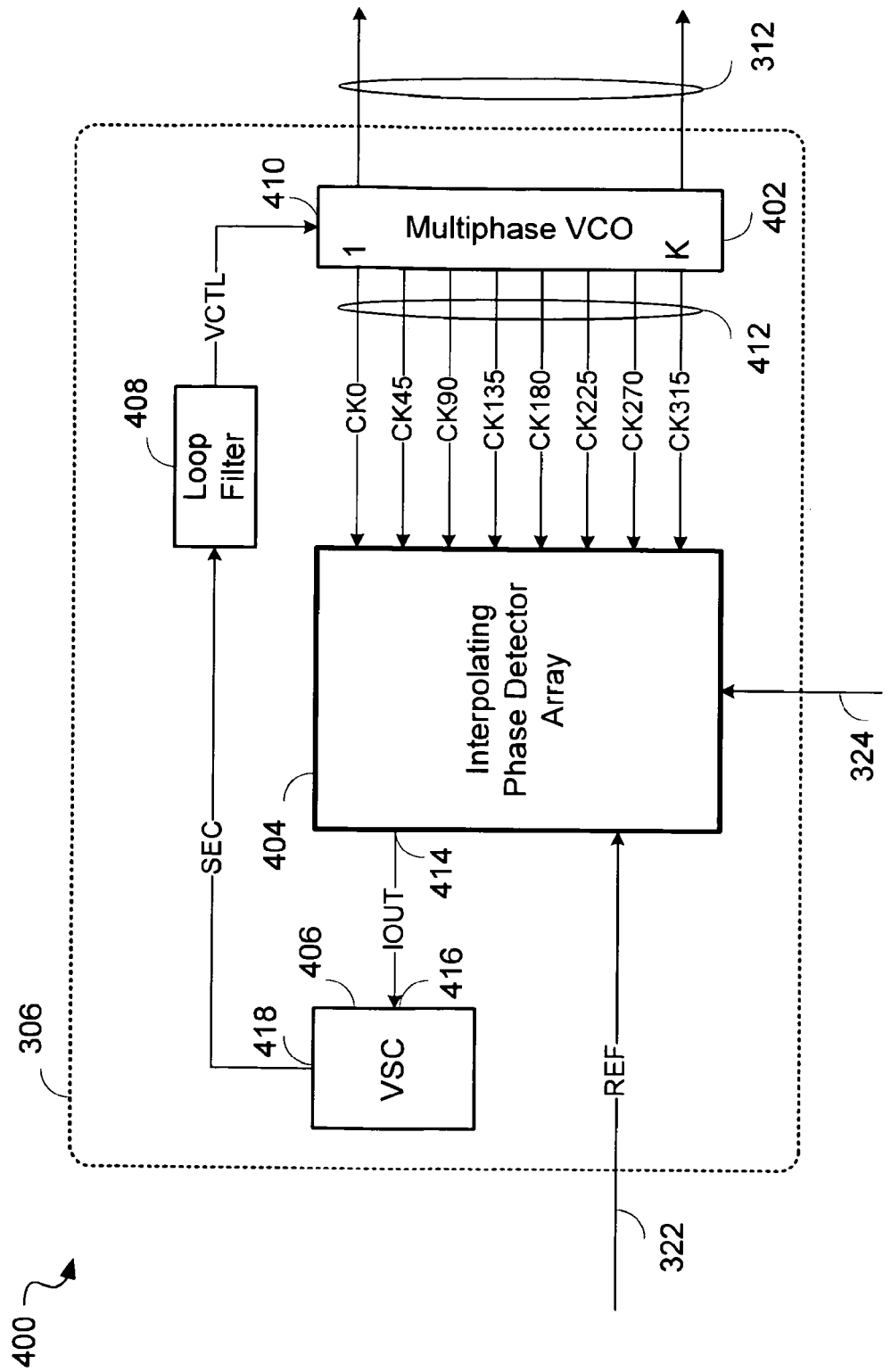
FIG. 4 shows a simplified block diagram 400 of the Multiphase Adjustable PLL 306 of the transceiver 208 of FIG. 3.

FIG. 4 shows a simplified block diagram 400 of the Multiphase Adjustable PLL 306 of the present invention. The Multiphase Adjustable PLL 306 comprises a Multiphase VCO 402; an Interpolating Phase Detector Array 404; a voltage shifting circuit (VSC) 406; and a loop filter 408. The Multiphase VCO 402 is an oscillator that may directly generate the multiphase sampling clock 312 (FIG. 3). The Multiphase VCO 402 may be conveniently implemented with a conventional ring oscillator, or advantageously in the form of a multipass Ring Oscillator enhanced with feed-backward connections as described in the U.S. patent application Ser. No. 11/984,852 filed Nov. 23, 2007 entitled "A VOLTAGE CONTROLLED OSCILLATOR (VCO) WITH A WIDE TUNING RANGE AND SUBSTANTIALLY CONSTANT VOLTAGE SWING OVER THE TUNING RANGE", which is incorporated herein by reference.

The Multiphase VCO 402 has a frequency control input 410, and outputs the multiphase sampling clock 312 (see FIG. 3), as well as a plurality of K phase shifted clock signals 412. In the preferred embodiment of the invention K=8, and the individual phase shifted clock signals are referred to as CK0, CK45, CK90, CK135, CK180, CK225, CK270, and CK 315, to symbolize their relative phase shifts in degrees with respect to the phase of the first phase shifted clock signal CK0.

The phase shifted clock signals 412 are input to the Interpolating Phase Detector Array 404; also input to the Interpolating Phase Detector Array 404 are the reference clock (REF) 322 and the phase control signal 324. A current output 414 of the Interpolating Phase Detector Array 404 generates a differential phase error current IOUT that is fed to a current input 416 of the voltage shifting circuit (VSC) 406. The VSC 406 converts the differential phase error current IOUT into a shifted error current SEC at a shifted error current output 418. The shifted error current SEC may be fed directly to the frequency control input 410 of the Multiphase VCO 402 via the loop filter 408 which processes the shifted error current SEC into the frequency control signal VCTL for inputting to the frequency control input 410 of the Multiphase VCO 402.

The Interpolating Phase Detector Array 404 generates the differential phase error current IOUT which indicates the phase difference between the reference clock (REF) 322 and a selected phase of the clock signal (412) generated by the Multiphase VCO 402. In general terms, the phase control signal 324 provides information that controls the phase selection. For example, the Interpolating Phase Detector Array 404 may select one of the phase shifted clock signals 412 (CK0 to CK 315) directly. Additional information provided by the phase control signal 324 allows the Interpolating Phase Detector Array 404 to interpolate between adjacent phases, for example CK135 and CK180, thus effectively selecting an intermediate interpolated phase as will be described in detail below.

The overall function of the Multiphase Adjustable PLL 306 is to generate the multiphase sampling clock 312 with a phase offset relative to the phase of the reference clock (REF) 322. The phase offset may be set to any value between 0 and 360, limited only by the resolution of the phase control signal 324 which carries a digital value representing the phase offset.

Figure 5:
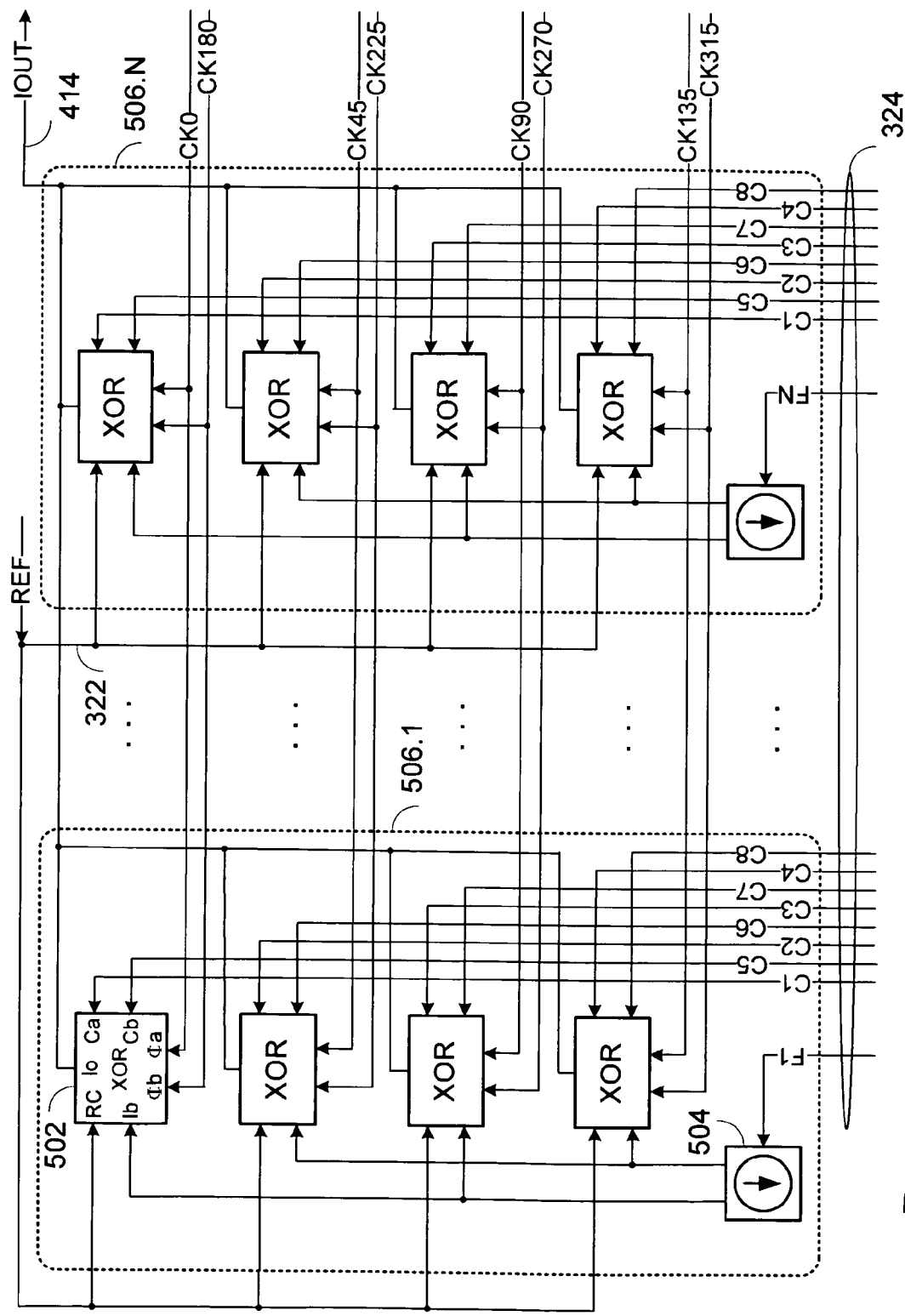
FIG. 5 shows a block diagram 500 of the Interpolating Phase Detector Array 404 of the Multiphase Adjustable PLL 306 of FIG. 4.

FIG. 5 shows a block diagram 500 of the Interpolating Phase Detector Array 404. The Interpolating Phase Detector Array 404 includes an array of XOR-blocks 502 and a set of steerable current sources 504. The XOR-blocks 502 are configured in an arrangement of N phase detector columns 506.$i$ ($i$=1 to N), wherein each phase detector column 506.$i$ includes a plurality of M=K/2=4 (K=8 in the preferred embodiment illustrated here) of the XOR-blocks 502, and one of the controllable steerable current sources 504. In all, the Interpolating Phase Detector Array 404 thus includes a plurality N*M of the XOR-blocks 502 and N steerable current sources 504, the XOR-blocks 502 being arranged in N columns and M rows.

Figure 6B:
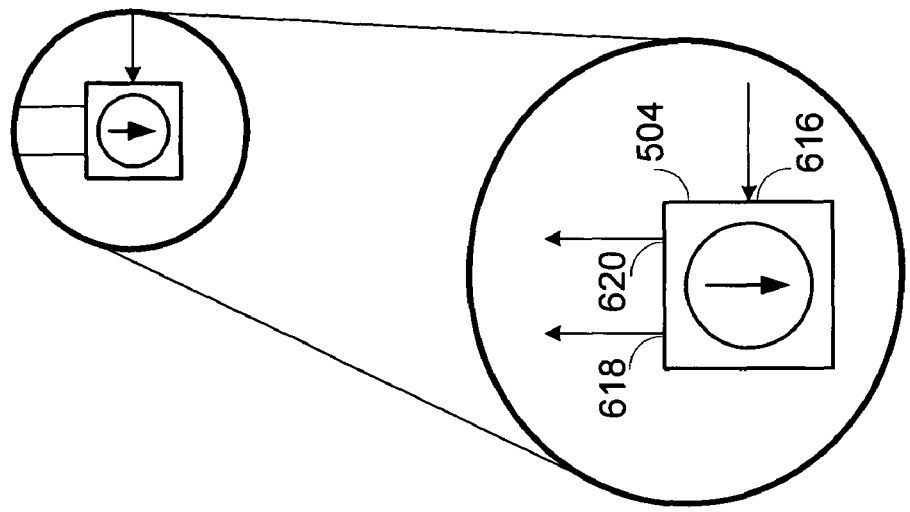
FIG. 6b is a magnified view of the typical steerable current source 504 shown in FIG. 5.
Figure 6A:
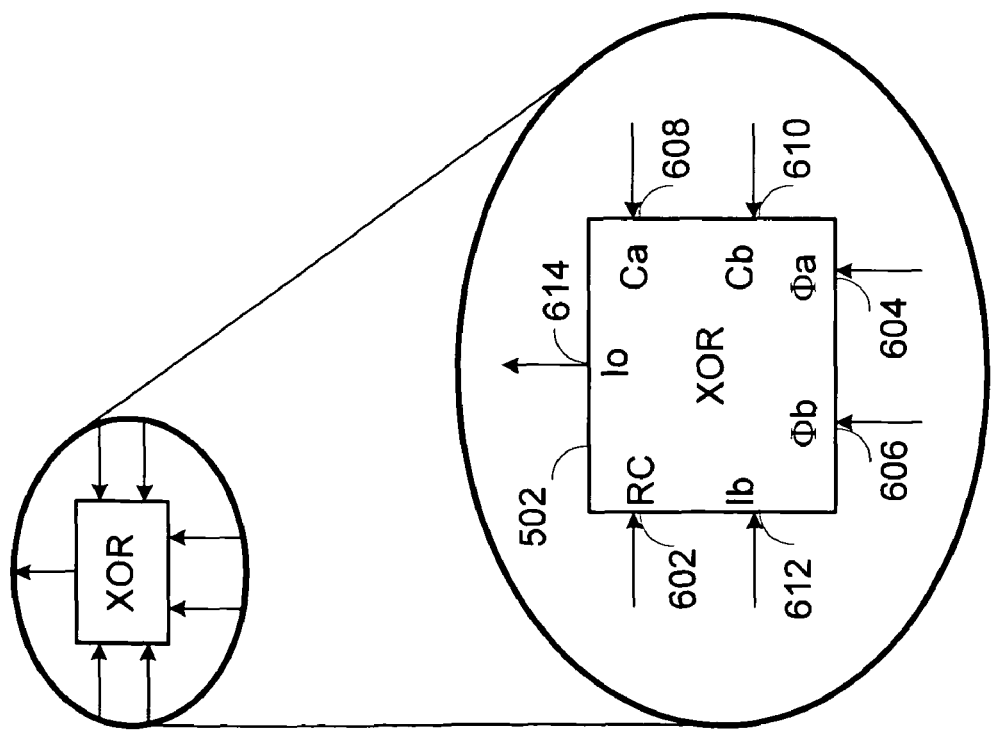
FIG. 6a is a magnified view of the typical XOR-block 502 shown in FIG. 5.

FIG. 6$a$ is a magnified view of the typical XOR-block 502 of FIG. 5, including reference labels for inputs and outputs. The XOR-block 502 includes a reference clock input 602 (RC); first and second phase shifted clock inputs 604 and 606 (Φa and Φb respectively); first and second coarse control inputs 608 and 610 (Ca and Cb respectively); and a bias current input 612 (Ib). The XOR-block 502 further includes a differential phase error output 614 (Io).

FIG. 6$b$ is a magnified view of the typical steerable current source 504 of FIG. 5, including reference labels for inputs and outputs. The steerable current source 504 includes a current steering input 616, and first and second current sink outputs 618 and 620. The steerable current source 504 provides a current which may be directed by the current steering input 616 to flow into one of the two current sink outputs 618 or 620.

The reader's attention is directed back to FIG. 5 for the continued description of the Interpolating Phase Detector Array 404, while referring to FIGS. 6$a$ and 6$b$ for the reference numerals of the inputs and outputs of the XOR-blocks 502 and of the steerable current sources 504.

The reference clock (REF) 322 is connected to the reference clock input 602 (RC) of each of the XOR-blocks 502. Similarly, the current output 414 of the Interpolating Phase Detector Array 404 (delivering the differential phase error current IOUT) is connected to the differential phase error output 614 (Io) of each of the XOR-blocks 502. The K=8 phase shifted clock signals (CK0, CK45, CK90, CK135, CK180, CK225, CK270, and CK 315) are connected to the phase shifted clock inputs 604 and 606 (Φa and Φb respectively) of selected ones of the XOR-blocks 502 as follows:

the phase shifted clock signal CK0 is connected to the first phase shifted clock input 604 (Φa) of each of the XOR-blocks 502 in the first row of the Interpolating Phase Detector Array 404;

the phase shifted clock signal CK45 is connected to the first phase shifted clock input 604 (Φa) of each of the XOR-blocks 502 in the second row of the Interpolating Phase Detector Array 404;

the phase shifted clock signal CK90 is connected to the first phase shifted clock input 604 (Φa) of each of the XOR-blocks 502 in the third row of the Interpolating Phase Detector Array 404;

the phase shifted clock signal CK135 is connected to the first phase shifted clock input 604 (Φa) of each of the XOR-blocks 502 in the fourth row of the Interpolating Phase Detector Array 404;

the phase shifted clock signal CK180 is connected to the second phase shifted clock input 606 (Φb) of each of the XOR-blocks 502 in the first row of the Interpolating Phase Detector Array 404;

the phase shifted clock signal CK225 is connected to the second phase shifted clock input 606 (Φb) of each of the XOR-blocks 502 in the second row of the Interpolating Phase Detector Array 404;

the phase shifted clock signal CK270 is connected to the second phase shifted clock input 606 (Φb) of each of the XOR-blocks 502 in the third row of the Interpolating Phase Detector Array 404; and the phase shifted clock signal CK315 is connected to the second phase shifted clock input 606 (Φb) of each of the XOR-blocks 502 in the fourth row of the Interpolating Phase Detector Array 404.

The phase control signal 324 is a multi-bit digital signal comprising a set of K (K=8 in the preferred embodiment) coarse control signals C1, C2, ..., C8, and a set of N fine control signals F1, F2, ... FN.

The coarse control signals C1, C2, ..., C8 of the phase control signal 324 are connected to the XOR-blocks 502 analogous to the phase shifted clock signals (CK0, CK45 ... CK 315), that is:

the coarse control signals C1 is connected to the first coarse control input 608 of each of the XOR-blocks 502 in the first row of the Interpolating Phase Detector Array 404;

the coarse control signals C2 is connected to the first coarse control input 608 of each of the XOR-blocks 502 in the second row of the Interpolating Phase Detector Array 404;

the coarse control signals C3 is connected to the first coarse control input 608 of each of the XOR-blocks 502 in the third row of the Interpolating Phase Detector Array 404;

the coarse control signals C4 is connected to the first coarse control input 608 of each of the XOR-blocks 502 in the fourth row of the Interpolating Phase Detector Array 404;

the coarse control signals C5 is connected to the second coarse control input 610 of each of the XOR-blocks 502 in the first row of the Interpolating Phase Detector Array 404;

the coarse control signals C6 is connected to the second coarse control input 610 of each of the XOR-blocks 502 in the second row of the Interpolating Phase Detector Array 404;

the coarse control signals C7 is connected to the second coarse control input 610 of each of the XOR-blocks 502 in the third row of the Interpolating Phase Detector Array 404; and the coarse control signals C8 is connected to the second coarse control input 610 of each of the XOR-blocks 502 in the fourth row of the Interpolating Phase Detector Array 404.

Every XOR-block 502 provides the capability of comparing the phase of the reference clock signal at the reference clock input 602 (RC) with the phase of a selected one of the phase shifted clock signals 412 (CK0 to CK 315) that are present at the phase shifted clock inputs 604 and 606 (Φa and Φb). The selected one of the phase shifted clock signals 412 is selected by the corresponding coarse control signals (C1 to C8) that are connected to the coarse control inputs 608 and 610 (Ca and Cb respectively).

The fine control signal F1 of the phase control signal 324 is connected to the current steering input 616 of the steerable current source 504 in the first phase detector column 506.1 of the Interpolating Phase Detector Array 404. The fine control signals F2 to FN are similarly connected to the steering inputs 616 of the steerable current sources 504 in the second to the Nth phase detector columns (506.2 to 506.N respectively).

The first current sink output 618 of the steerable current source 504 in each of the N phase detector columns 506.1 to 506.N is connected to the bias current inputs 612 (Ib) of the XOR-blocks 502 that are located in the odd numbered row (rows 1 and 3) of the respective phase detector column 506.1 to 506.N.

Similarly, the second current sink output 620 of the steerable current source 504 in each of the N phase detector columns 506.1 to 506.N is connected to the bias current inputs 612 (Ib) of the XOR-blocks 502 that are located in the even numbered row (rows 2 and 4) of the respective phase detector column 506.1 to 506.N. The differential phase error outputs 614 (Io) of all XOR-blocks 502 are tied together to the current output 414 of the Interpolating Phase Detector Array 404, providing the differential phase error current IOUT.

The Interpolating Phase Detector Array 404 as a whole provides the ability of comparing the phase of the reference clock (REF) 322 against the phase of any of the phase shifted clock signals (CK0 to CK315) through selected XOR-blocks 502, the selection being accomplished by means of the multi-bit phase control signal 324. The output currents of the selected XOR-blocks 502 may be combined (summed) into the differential phase error current IOUT, while XOR-blocks 502 that are not selected, do not contribute to the differential phase error current IOUT.

Any XOR-block 502 may be selected by setting either of its coarse control inputs 608 or 610 (Ca and Cb respectively), but not both to "ON", and at the same time supplying bias current from one of the connected current sink outputs 618 or 620 of the connected steerable current source 504. Recall that the steerable current source 504 sinks current only into one of its current sink output 618 or 620 as controlled by its current steering input 616, and odd/even rows of XOR-blocks 502 are connected only to either the first current sink output 618 or the second current sink output 620 of the associated steerable current source 504.

Figure 7:
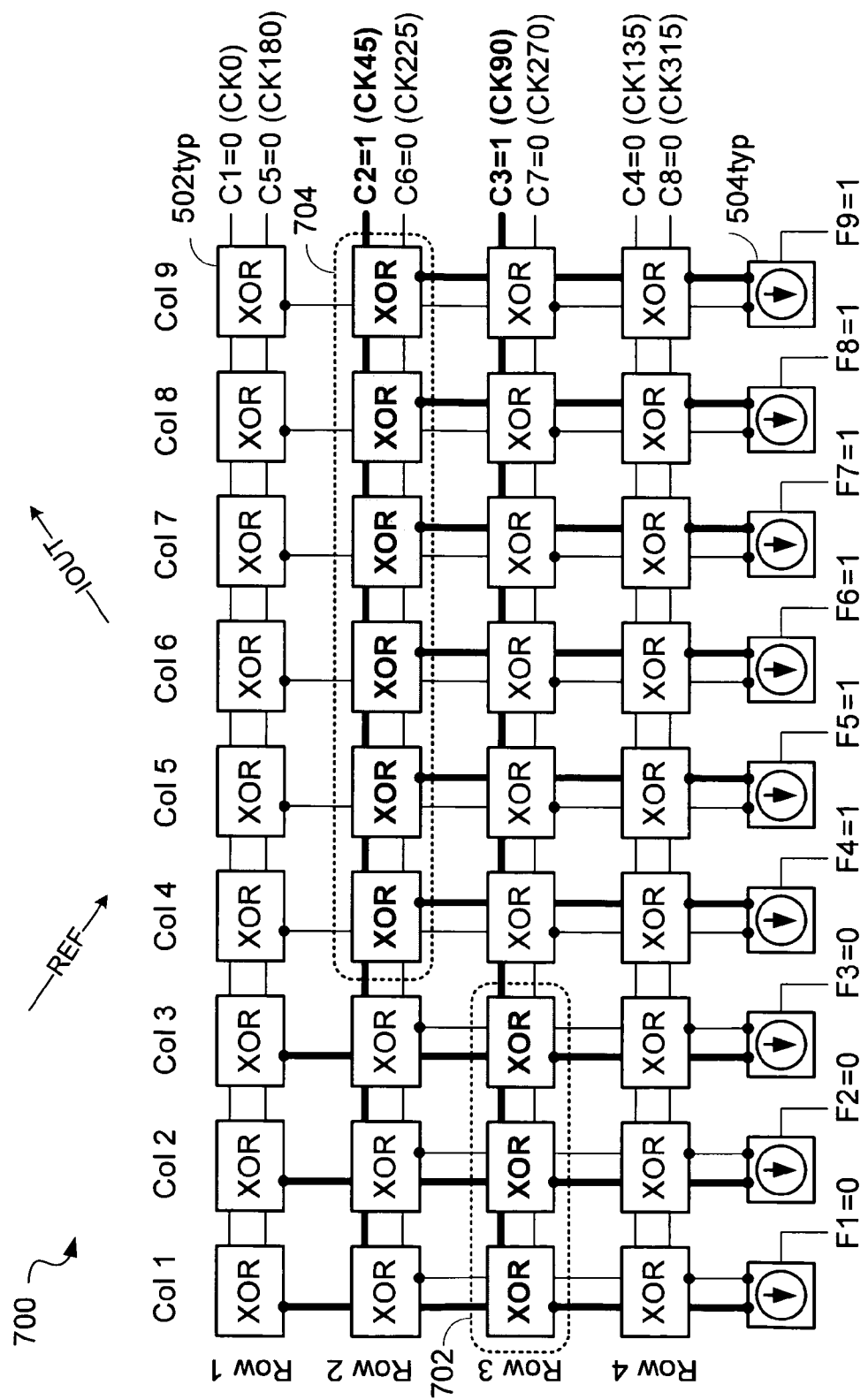
FIG. 7 shows a simplified view 700 of the Interpolating Phase Detector Array 404 of FIG. 5, to illustrate an exemplary operational state.

FIG. 7 shows a simplified view 700 of the Interpolating Phase Detector Array 404, to illustrate phase interpolation in an exemplary operational state. In the simplified view 700, a preferred configuration of the Interpolating Phase Detector Array 404 is shown, with M=4 rows and N=9 columns. The Interpolating Phase Detector Array 404 comprises a matrix of nine columns (Col 1 to Col 9) by four rows (Row 1 to Row 4) of XOR-blocks 502, combined with a row of nine steerable current sources 504. The reference clock REF (as shown in FIG. 5, but omitted in the illustration of FIG. 7) is distributed to the reference clock inputs RC of all XOR-blocks 502 (FIGS. 5 and 6). Similarly, all XOR-blocks 502 contribute to the differential phase error current IOUT (implied, but not illustrated in FIG. 7) through their respective differential phase error outputs Io (cf. FIGS. 5 and 6). Also, as shown in greater detail in FIG. 5, the coarse control signals C1 to C8 are input to the XOR-blocks 502 row by row, that is C1 and C5 to the control inputs Ca and Cb of the XOR-blocks 502 in the row 1, C2 and C6 in the row 2, C3 and C7 in the row 3, and C4 and C8 in the row 4. The phase shifted clock signals CK0 to CK 315 are similarly input to the corresponding phase shifted clock inputs 604 and 606 (□a and □b respectively) of each XOR-block 502 (FIG. 5).

The state (logic "0" or "1") of the coarse control signals (C1 to C8) connected to the control inputs Ca and Cb of the XOR-block 502 determines whether the XOR-block 502 is enabled, and the phase of which of the phase shifted clock signals (CK0 to CK315) connected to the phase shifted clock inputs 604 and 606 (Φa and Φb) will be processed. More precisely, the two coarse control signals that are connected to any XOR-block 512 may:

both be "0" in which case the entire XOR-block 512 is disabled;
not both be "1" which is not a legal input combination;
be "1" and "0" (Ca and Cb) respectively in which case the phase shifted clock signal (CK0 to CK135) that is connected to the first phase shifted clock input 604 (Φa) is compared with the reference clock signal (REF) connected at the reference clock input RC, but only if a bias current is provided to the XOR-block 502 at its bias current input Ib; and similarly
be "0" and "1" (Ca and Cb) respectively in which case the phase shifted clock signal (CK180 to CK315) that is connected to the second phase shifted clock input 606 (Φb) is compared with the reference clock signal (REF), but only if a bias current is provided to the XOR-block 502 at its bias current input Ib.

Also, as already shown in greater detail in FIG. 5, the current sink outputs 618 and 620 of the steerable current source 504 in each of the nine columns (Col 1 to Col 9) are connected to the bias current inputs Ib of the XOR-blocks 502 that are located in the same column as the steerable current source 504 in the odd and even numbered rows respectively.

The state (logic "0" or "1") of the fine control signal Fx (x=1 to 9) connected to the corresponding fine control input 616 (FIG. 6b) of the steerable current source 504 determines whether the bias current inputs 612 (Ib) (FIG. 6a) of the XOR-blocks 502 in the same column, in the odd or even rows respectively may be supplied with bias current. The steerable current sources 504 may all be dimensioned equally, thus providing one unit of bias current each.

To enable a specific XOR-block 502, one of the two connected coarse control signals must be at logic "1", and at the same time, a bias current must be provided by the steerable current source 504 that is located in the same column as the specific XOR-block 502.

FIG. 7 shows two groups of enabled XOR-block 502 as shaded blocks. A first group 702 includes three enabled XOR-blocks 502 in the Row 3 intersecting with the columns Col 1, Col 2, and Col 3. The three XOR-blocks 502 of the first group 702 are supplied with bias current from the steerable current sources 504 with fine control signals F1, F2, and F3 which are all logical "0", thus supplying bias current only to odd numbered rows (including the Row 3). At the same time, the enabled XOR-blocks 502 in the first group 702 receive the phase shifted clock signal CK90 which is enabled by the coarse control signal C3="1". As a result, the three enabled XOR-blocks 502 in the first group 702 all perform the same function, that is a phase comparison between the reference clock signal REF and the phase shifted clock signal CK90. Because they are each supplied with one unit of bias current, they together contribute three units of current to the differential phase error current IOUT (to which all enabled XOR-blocks 502 contribute).

A second group 704 includes six enabled XOR-blocks 502 in the Row 2 intersecting with the columns Col 4 to 9. The six XOR-blocks 502 of the second group 704 are supplied with bias current from the steerable current sources 504 with fine control signals F4 to F9 which are all logical "1", thus supplying bias current only to even numbered rows (including the Row 2). At the same time, the enabled XOR-blocks 502 in the second group 704 receive the phase shifted clock signal CK45 which is enabled by the coarse control signal C2="1". As a result, these six enabled XOR-blocks 502 in the second group 704 all perform the same function, that is a phase comparison between the reference clock signal REF and the phase shifted clock signal CK45. Because they are each supplied with one unit of bias current each, they together contribute six units of current to the differential phase error current IOUT.

All other XOR-blocks 502, that is all those in the Rows 1 and 4, as well as the three blocks in the Row 2 (in Cols 1 to 3) and the six blocks in the Row 3 (in the Cols 4 to 9), are not enabled and contribute no current to the differential phase error current IOUT.

The overall resulting differential phase error current IOUT is thus the sum of the differential output currents from the enabled XOR-blocks 502 in the first and second groups 702 and 704. The blocks in the first group 702 together deliver a differential output current representative of the phase difference between the reference clock signal REF and the phase shifted clock signal CK90, with a current strength of three units. Similarly, the blocks in the second group 704 together deliver a differential output current representative of the phase difference between the reference clock signal REF and the phase shifted clock signal CK45, with a current strength of six units. This combination is effectively the same differential phase error current that would have been delivered by a virtual single phase comparator, connected to the reference clock signal REF and a hypothetical phase shifted clock signal with a phase of (6*45+3*90)/9=60 degrees. As is usual in PLLs, the Multiphase Adjustable PLT 306 (see FIG. 4), will control the Multiphase VCO 410 in a manner that results in a zero or close to zero phase error output from the Interpolating Phase Detector Array 404. In effect (in the example given above) the phase of the first output (CK0) of the Multiphase VCO 410 will be running at a phase difference of 60 degrees with respect to the reference clock.

By adjusting the settings of the coarse and fine control signals, other phase offsets may be easily achieved, with a high resolution derived as follows:

The Interpolating Phase Detector Array 404, being driven with a reference clock signal and K phase shifted clock signals that are spaced in 360/K degree steps, is capable of being set to provide phase comparison with a resolution of 360/(K*N) degree steps, by linear interpolation between any two adjacent phases of the phase shifted clock signals. This assumes that all steerable current sources 504 provide the same unit bias current.

An advantage of the present invention over the prior art is based on the fact that all steerable current sources 504 may provide the same amount of bias current (i.e. one unit), and each XOR-block 502, when enabled, then always carries the same amount of current. This allows all circuits in the Interpolating Phase Detector Array 404 to be dimensioned to provide high performance (gain, speed) at this single current level. It is unnecessary to provide circuits with a greater dynamic range (the range of IOUT, for example) that would inevitably result in larger structures that are capable of handling the upper end of the dynamic range but would introduce lower performance at the lower current levels. In the invention, the dynamic range is provided for by the paralleling of equivalent circuits, each dimensioned such as to handle a single current level.

In a modification of the embodiment described above, higher resolution of interpolation may be achieved when one of the N steerable current sources 504 is designed to provide a half unit of bias current to the XOR-blocks 502 in the corresponding column. Expressed differently, (N−1) steerable current sources 504 generates (N−1) single units of bias current, and one steerable current source 504 generates a half unit of bias current. These N steerable current sources 504 can be controlled using their current steering input 616 to provide bias currents to N enabled XOR-blocks 502 in 17 distinct combinations, thus providing a resolution of 360/(K*(2*N−1)), in half steps.

The following four tables show control settings Interpolating Phase Detector Array 404 according to the preferred embodiment which provides control to set the phase ranging from 0 degrees to 360 degrees, in increments of 2.65 degrees.

Table 1 shows the steps covering the range of 0 to 90 degrees.

Table 2 shows the steps covering the range of 90 to 180 degrees.

Table 3 shows the steps covering the range of 180 to 270 degrees.

Table 4 shows the steps covering the range of 270 to 360 degrees.

All four tables include the following columns:

"Step", consecutively numbered steps, from 0 to 135;

(Note that the steps wrap at 360 degrees which is the same as 0 degrees, step# 0)

"Phase", the phase in degrees;

Coarse Control settings C1 to C8; and

Fine Control settings F1 to F9.

TABLE 1

Control codes covering the range of 0 to 90 degrees.

| Step | Phase | C1 | C2 | C3 | C4 | C5 | C6 | C7 | C8 | F1 | F2 | F3 | F4 | F5 | F6 | F7 | F8 | F9 |
|---|---|---|---|---|---|---|---|---|---|---|---|---|---|---|---|---|---|---|
| 0 | 0.00 | 1 | 1 | 0 | 0 | 0 | 0 | 0 | 0 | 0 | 0 | 0 | 0 | 0 | 0 | 0 | 0 | 0 |
| 1 | 2.65 | 1 | 1 | 0 | 0 | 0 | 0 | 0 | 0 | 0 | 0 | 0 | 0 | 0 | 0 | 0 | 0 | 1 |
| 2 | 5.29 | 1 | 1 | 0 | 0 | 0 | 0 | 0 | 0 | 0 | 0 | 0 | 0 | 0 | 0 | 0 | 1 | 0 |
| 3 | 7.94 | 1 | 1 | 0 | 0 | 0 | 0 | 0 | 0 | 0 | 0 | 0 | 0 | 0 | 0 | 0 | 1 | 1 |
| 4 | 10.59 | 1 | 1 | 0 | 0 | 0 | 0 | 0 | 0 | 0 | 0 | 0 | 0 | 0 | 0 | 1 | 1 | 0 |
| 5 | 13.24 | 1 | 1 | 0 | 0 | 0 | 0 | 0 | 0 | 0 | 0 | 0 | 0 | 0 | 0 | 1 | 1 | 1 |
| 6 | 15.88 | 1 | 1 | 0 | 0 | 0 | 0 | 0 | 0 | 0 | 0 | 0 | 0 | 0 | 1 | 1 | 1 | 0 |
| 7 | 18.53 | 1 | 1 | 0 | 0 | 0 | 0 | 0 | 0 | 0 | 0 | 0 | 0 | 0 | 1 | 1 | 1 | 1 |
| 8 | 21.18 | 1 | 1 | 0 | 0 | 0 | 0 | 0 | 0 | 0 | 0 | 0 | 0 | 1 | 1 | 1 | 1 | 0 |

TABLE 1-continued

Control codes covering the range of 0 to 90 degrees.

| Step | Phase | C1 | C2 | C3 | C4 | C5 | C6 | C7 | C8 | F1 | F2 | F3 | F4 | F5 | F6 | F7 | F8 | F9 |
|---|---|---|---|---|---|---|---|---|---|---|---|---|---|---|---|---|---|---|
| 9  | 23.82 | 1 | 1 | 0 | 0 | 0 | 0 | 0 | 0 | 0 | 0 | 0 | 0 | 1 | 1 | 1 | 1 | 1 |
| 10 | 26.47 | 1 | 1 | 0 | 0 | 0 | 0 | 0 | 0 | 0 | 0 | 0 | 1 | 1 | 1 | 1 | 1 | 0 |
| 11 | 29.12 | 1 | 1 | 0 | 0 | 0 | 0 | 0 | 0 | 0 | 0 | 0 | 1 | 1 | 1 | 1 | 1 | 1 |
| 12 | 31.76 | 1 | 1 | 0 | 0 | 0 | 0 | 0 | 0 | 0 | 0 | 1 | 1 | 1 | 1 | 1 | 1 | 0 |
| 13 | 34.41 | 1 | 1 | 0 | 0 | 0 | 0 | 0 | 0 | 0 | 0 | 1 | 1 | 1 | 1 | 1 | 1 | 1 |
| 14 | 37.06 | 1 | 1 | 0 | 0 | 0 | 0 | 0 | 0 | 0 | 1 | 1 | 1 | 1 | 1 | 1 | 1 | 0 |
| 15 | 39.71 | 1 | 1 | 0 | 0 | 0 | 0 | 0 | 0 | 0 | 1 | 1 | 1 | 1 | 1 | 1 | 1 | 1 |
| 16 | 42.35 | 1 | 1 | 0 | 0 | 0 | 0 | 0 | 0 | 1 | 1 | 1 | 1 | 1 | 1 | 1 | 1 | 0 |
| 17 | 45.00 | 0 | 1 | 1 | 0 | 0 | 0 | 0 | 0 | 1 | 1 | 1 | 1 | 1 | 1 | 1 | 1 | 1 |
| 18 | 47.65 | 0 | 1 | 1 | 0 | 0 | 0 | 0 | 0 | 1 | 1 | 1 | 1 | 1 | 1 | 1 | 1 | 0 |
| 19 | 50.29 | 0 | 1 | 1 | 0 | 0 | 0 | 0 | 0 | 0 | 1 | 1 | 1 | 1 | 1 | 1 | 1 | 1 |
| 20 | 52.94 | 0 | 1 | 1 | 0 | 0 | 0 | 0 | 0 | 0 | 1 | 1 | 1 | 1 | 1 | 1 | 1 | 0 |
| 21 | 55.59 | 0 | 1 | 1 | 0 | 0 | 0 | 0 | 0 | 0 | 0 | 1 | 1 | 1 | 1 | 1 | 1 | 1 |
| 22 | 58.24 | 0 | 1 | 1 | 0 | 0 | 0 | 0 | 0 | 0 | 0 | 1 | 1 | 1 | 1 | 1 | 1 | 0 |
| 23 | 60.88 | 0 | 1 | 1 | 0 | 0 | 0 | 0 | 0 | 0 | 0 | 0 | 1 | 1 | 1 | 1 | 1 | 1 |
| 24 | 63.53 | 0 | 1 | 1 | 0 | 0 | 0 | 0 | 0 | 0 | 0 | 0 | 1 | 1 | 1 | 1 | 1 | 0 |
| 25 | 66.18 | 0 | 1 | 1 | 0 | 0 | 0 | 0 | 0 | 0 | 0 | 0 | 0 | 1 | 1 | 1 | 1 | 1 |
| 26 | 68.82 | 0 | 1 | 1 | 0 | 0 | 0 | 0 | 0 | 0 | 0 | 0 | 0 | 1 | 1 | 1 | 1 | 0 |
| 27 | 71.47 | 0 | 1 | 1 | 0 | 0 | 0 | 0 | 0 | 0 | 0 | 0 | 0 | 0 | 1 | 1 | 1 | 1 |
| 28 | 74.12 | 0 | 1 | 1 | 0 | 0 | 0 | 0 | 0 | 0 | 0 | 0 | 0 | 0 | 1 | 1 | 1 | 0 |
| 29 | 76.76 | 0 | 1 | 1 | 0 | 0 | 0 | 0 | 0 | 0 | 0 | 0 | 0 | 0 | 0 | 1 | 1 | 1 |
| 30 | 79.41 | 0 | 1 | 1 | 0 | 0 | 0 | 0 | 0 | 0 | 0 | 0 | 0 | 0 | 0 | 1 | 1 | 0 |
| 31 | 82.06 | 0 | 1 | 1 | 0 | 0 | 0 | 0 | 0 | 0 | 0 | 0 | 0 | 0 | 0 | 0 | 1 | 1 |
| 32 | 84.71 | 0 | 1 | 1 | 0 | 0 | 0 | 0 | 0 | 0 | 0 | 0 | 0 | 0 | 0 | 0 | 1 | 0 |
| 33 | 87.35 | 0 | 1 | 1 | 0 | 0 | 0 | 0 | 0 | 0 | 0 | 0 | 0 | 0 | 0 | 0 | 0 | 1 |
| 34 | 90.00 | 0 | 0 | 1 | 1 | 0 | 0 | 0 | 0 | 0 | 0 | 0 | 0 | 0 | 0 | 0 | 0 | 0 |

TABLE 2

Control codes covering the range of 90 to 180 degrees.

| Step | Phase | C1 | C2 | C3 | C4 | C5 | C6 | C7 | C8 | F1 | F2 | F3 | F4 | F5 | F6 | F7 | F8 | F9 |
|---|---|---|---|---|---|---|---|---|---|---|---|---|---|---|---|---|---|---|
| 34 | 90.00  | 0 | 0 | 1 | 1 | 0 | 0 | 0 | 0 | 0 | 0 | 0 | 0 | 0 | 0 | 0 | 0 | 0 |
| 35 | 92.65  | 0 | 0 | 1 | 1 | 0 | 0 | 0 | 0 | 0 | 0 | 0 | 0 | 0 | 0 | 0 | 0 | 1 |
| 36 | 95.29  | 0 | 0 | 1 | 1 | 0 | 0 | 0 | 0 | 0 | 0 | 0 | 0 | 0 | 0 | 0 | 1 | 0 |
| 37 | 97.94  | 0 | 0 | 1 | 1 | 0 | 0 | 0 | 0 | 0 | 0 | 0 | 0 | 0 | 0 | 0 | 1 | 1 |
| 38 | 100.59 | 0 | 0 | 1 | 1 | 0 | 0 | 0 | 0 | 0 | 0 | 0 | 0 | 0 | 0 | 1 | 1 | 0 |
| 39 | 103.24 | 0 | 0 | 1 | 1 | 0 | 0 | 0 | 0 | 0 | 0 | 0 | 0 | 0 | 0 | 1 | 1 | 1 |
| 40 | 105.88 | 0 | 0 | 1 | 1 | 0 | 0 | 0 | 0 | 0 | 0 | 0 | 0 | 0 | 1 | 1 | 1 | 0 |
| 41 | 108.53 | 0 | 0 | 1 | 1 | 0 | 0 | 0 | 0 | 0 | 0 | 0 | 0 | 0 | 1 | 1 | 1 | 1 |
| 42 | 111.18 | 0 | 0 | 1 | 1 | 0 | 0 | 0 | 0 | 0 | 0 | 0 | 0 | 1 | 1 | 1 | 1 | 0 |
| 43 | 113.82 | 0 | 0 | 1 | 1 | 0 | 0 | 0 | 0 | 0 | 0 | 0 | 0 | 1 | 1 | 1 | 1 | 1 |
| 44 | 116.47 | 0 | 0 | 1 | 1 | 0 | 0 | 0 | 0 | 0 | 0 | 0 | 1 | 1 | 1 | 1 | 1 | 0 |
| 45 | 119.12 | 0 | 0 | 1 | 1 | 0 | 0 | 0 | 0 | 0 | 0 | 0 | 1 | 1 | 1 | 1 | 1 | 1 |
| 46 | 121.76 | 0 | 0 | 1 | 1 | 0 | 0 | 0 | 0 | 0 | 0 | 1 | 1 | 1 | 1 | 1 | 1 | 0 |
| 47 | 124.41 | 0 | 0 | 1 | 1 | 0 | 0 | 0 | 0 | 0 | 0 | 1 | 1 | 1 | 1 | 1 | 1 | 1 |
| 48 | 127.06 | 0 | 0 | 1 | 1 | 0 | 0 | 0 | 0 | 0 | 1 | 1 | 1 | 1 | 1 | 1 | 1 | 0 |
| 49 | 129.71 | 0 | 0 | 1 | 1 | 0 | 0 | 0 | 0 | 0 | 1 | 1 | 1 | 1 | 1 | 1 | 1 | 1 |
| 50 | 132.35 | 0 | 0 | 1 | 1 | 0 | 0 | 0 | 0 | 1 | 1 | 1 | 1 | 1 | 1 | 1 | 1 | 0 |
| 51 | 135.00 | 0 | 0 | 0 | 1 | 1 | 0 | 0 | 0 | 1 | 1 | 1 | 1 | 1 | 1 | 1 | 1 | 1 |
| 52 | 137.65 | 0 | 0 | 0 | 1 | 1 | 0 | 0 | 0 | 1 | 1 | 1 | 1 | 1 | 1 | 1 | 1 | 0 |
| 53 | 140.29 | 0 | 0 | 0 | 1 | 1 | 0 | 0 | 0 | 0 | 1 | 1 | 1 | 1 | 1 | 1 | 1 | 1 |
| 54 | 142.94 | 0 | 0 | 0 | 1 | 1 | 0 | 0 | 0 | 0 | 1 | 1 | 1 | 1 | 1 | 1 | 1 | 0 |
| 55 | 145.59 | 0 | 0 | 0 | 1 | 1 | 0 | 0 | 0 | 0 | 0 | 1 | 1 | 1 | 1 | 1 | 1 | 1 |
| 56 | 148.24 | 0 | 0 | 0 | 1 | 1 | 0 | 0 | 0 | 0 | 0 | 1 | 1 | 1 | 1 | 1 | 1 | 0 |
| 57 | 150.88 | 0 | 0 | 0 | 1 | 1 | 0 | 0 | 0 | 0 | 0 | 0 | 1 | 1 | 1 | 1 | 1 | 1 |
| 58 | 153.53 | 0 | 0 | 0 | 1 | 1 | 0 | 0 | 0 | 0 | 0 | 0 | 1 | 1 | 1 | 1 | 1 | 0 |
| 59 | 156.18 | 0 | 0 | 0 | 1 | 1 | 0 | 0 | 0 | 0 | 0 | 0 | 0 | 1 | 1 | 1 | 1 | 1 |
| 60 | 158.82 | 0 | 0 | 0 | 1 | 1 | 0 | 0 | 0 | 0 | 0 | 0 | 0 | 1 | 1 | 1 | 1 | 0 |
| 61 | 161.47 | 0 | 0 | 0 | 1 | 1 | 0 | 0 | 0 | 0 | 0 | 0 | 0 | 0 | 1 | 1 | 1 | 1 |
| 62 | 164.12 | 0 | 0 | 0 | 1 | 1 | 0 | 0 | 0 | 0 | 0 | 0 | 0 | 0 | 1 | 1 | 1 | 0 |
| 63 | 166.76 | 0 | 0 | 0 | 1 | 1 | 0 | 0 | 0 | 0 | 0 | 0 | 0 | 0 | 0 | 1 | 1 | 1 |
| 64 | 169.41 | 0 | 0 | 0 | 1 | 1 | 0 | 0 | 0 | 0 | 0 | 0 | 0 | 0 | 0 | 1 | 1 | 0 |
| 65 | 172.06 | 0 | 0 | 0 | 1 | 1 | 0 | 0 | 0 | 0 | 0 | 0 | 0 | 0 | 0 | 0 | 1 | 1 |
| 66 | 174.71 | 0 | 0 | 0 | 1 | 1 | 0 | 0 | 0 | 0 | 0 | 0 | 0 | 0 | 0 | 0 | 1 | 0 |
| 67 | 177.35 | 0 | 0 | 0 | 1 | 1 | 0 | 0 | 0 | 0 | 0 | 0 | 0 | 0 | 0 | 0 | 0 | 1 |
| 68 | 180.00 | 0 | 0 | 0 | 0 | 1 | 1 | 0 | 0 | 0 | 0 | 0 | 0 | 0 | 0 | 0 | 0 | 0 |

TABLE 3

Control codes covering the range of 180 to 270 degrees.

| Step | Phase | C1 | C2 | C3 | C4 | C5 | C6 | C7 | C8 | F1 | F2 | F3 | F4 | F5 | F6 | F7 | F8 | F9 |
|---|---|---|---|---|---|---|---|---|---|---|---|---|---|---|---|---|---|---|
| 68 | 180.00 | 0 | 0 | 0 | 0 | 1 | 1 | 0 | 0 | 0 | 0 | 0 | 0 | 0 | 0 | 0 | 0 | 0 |
| 69 | 182.65 | 0 | 0 | 0 | 0 | 1 | 1 | 0 | 0 | 0 | 0 | 0 | 0 | 0 | 0 | 0 | 0 | 1 |
| 70 | 185.29 | 0 | 0 | 0 | 0 | 1 | 1 | 0 | 0 | 0 | 0 | 0 | 0 | 0 | 0 | 0 | 1 | 0 |
| 71 | 187.94 | 0 | 0 | 0 | 0 | 1 | 1 | 0 | 0 | 0 | 0 | 0 | 0 | 0 | 0 | 0 | 1 | 1 |
| 72 | 190.59 | 0 | 0 | 0 | 0 | 1 | 1 | 0 | 0 | 0 | 0 | 0 | 0 | 0 | 0 | 1 | 1 | 0 |
| 73 | 193.24 | 0 | 0 | 0 | 0 | 1 | 1 | 0 | 0 | 0 | 0 | 0 | 0 | 0 | 0 | 1 | 1 | 1 |
| 74 | 195.88 | 0 | 0 | 0 | 0 | 1 | 1 | 0 | 0 | 0 | 0 | 0 | 0 | 0 | 1 | 1 | 1 | 0 |
| 75 | 198.53 | 0 | 0 | 0 | 0 | 1 | 1 | 0 | 0 | 0 | 0 | 0 | 0 | 0 | 1 | 1 | 1 | 1 |
| 76 | 201.18 | 0 | 0 | 0 | 0 | 1 | 1 | 0 | 0 | 0 | 0 | 0 | 0 | 1 | 1 | 1 | 1 | 0 |
| 77 | 203.82 | 0 | 0 | 0 | 0 | 1 | 1 | 0 | 0 | 0 | 0 | 0 | 0 | 1 | 1 | 1 | 1 | 1 |
| 78 | 206.47 | 0 | 0 | 0 | 0 | 1 | 1 | 0 | 0 | 0 | 0 | 0 | 1 | 1 | 1 | 1 | 1 | 0 |
| 79 | 209.12 | 0 | 0 | 0 | 0 | 1 | 1 | 0 | 0 | 0 | 0 | 0 | 1 | 1 | 1 | 1 | 1 | 1 |
| 80 | 211.76 | 0 | 0 | 0 | 0 | 1 | 1 | 0 | 0 | 0 | 0 | 1 | 1 | 1 | 1 | 1 | 1 | 0 |
| 81 | 214.41 | 0 | 0 | 0 | 0 | 1 | 1 | 0 | 0 | 0 | 0 | 1 | 1 | 1 | 1 | 1 | 1 | 1 |
| 82 | 217.06 | 0 | 0 | 0 | 0 | 1 | 1 | 0 | 0 | 0 | 1 | 1 | 1 | 1 | 1 | 1 | 1 | 0 |
| 83 | 219.71 | 0 | 0 | 0 | 0 | 1 | 1 | 0 | 0 | 0 | 1 | 1 | 1 | 1 | 1 | 1 | 1 | 1 |
| 84 | 222.35 | 0 | 0 | 0 | 0 | 1 | 1 | 0 | 0 | 1 | 1 | 1 | 1 | 1 | 1 | 1 | 1 | 0 |
| 85 | 225.00 | 0 | 0 | 0 | 0 | 0 | 1 | 1 | 0 | 1 | 1 | 1 | 1 | 1 | 1 | 1 | 1 | 1 |
| 86 | 227.65 | 0 | 0 | 0 | 0 | 0 | 1 | 1 | 0 | 1 | 1 | 1 | 1 | 1 | 1 | 1 | 1 | 0 |
| 87 | 230.29 | 0 | 0 | 0 | 0 | 0 | 1 | 1 | 0 | 0 | 1 | 1 | 1 | 1 | 1 | 1 | 1 | 1 |
| 88 | 232.94 | 0 | 0 | 0 | 0 | 0 | 1 | 1 | 0 | 0 | 1 | 1 | 1 | 1 | 1 | 1 | 1 | 0 |
| 89 | 235.59 | 0 | 0 | 0 | 0 | 0 | 1 | 1 | 0 | 0 | 0 | 1 | 1 | 1 | 1 | 1 | 1 | 1 |
| 90 | 238.24 | 0 | 0 | 0 | 0 | 0 | 1 | 1 | 0 | 0 | 0 | 1 | 1 | 1 | 1 | 1 | 1 | 0 |
| 91 | 240.88 | 0 | 0 | 0 | 0 | 0 | 1 | 1 | 0 | 0 | 0 | 0 | 1 | 1 | 1 | 1 | 1 | 1 |
| 92 | 243.53 | 0 | 0 | 0 | 0 | 0 | 1 | 1 | 0 | 0 | 0 | 0 | 1 | 1 | 1 | 1 | 1 | 0 |
| 93 | 246.18 | 0 | 0 | 0 | 0 | 0 | 1 | 1 | 0 | 0 | 0 | 0 | 0 | 1 | 1 | 1 | 1 | 1 |
| 94 | 248.82 | 0 | 0 | 0 | 0 | 0 | 1 | 1 | 0 | 0 | 0 | 0 | 0 | 1 | 1 | 1 | 1 | 0 |
| 95 | 251.47 | 0 | 0 | 0 | 0 | 0 | 1 | 1 | 0 | 0 | 0 | 0 | 0 | 0 | 1 | 1 | 1 | 1 |
| 96 | 254.12 | 0 | 0 | 0 | 0 | 0 | 1 | 1 | 0 | 0 | 0 | 0 | 0 | 0 | 1 | 1 | 1 | 0 |
| 97 | 256.76 | 0 | 0 | 0 | 0 | 0 | 1 | 1 | 0 | 0 | 0 | 0 | 0 | 0 | 0 | 1 | 1 | 1 |
| 98 | 259.41 | 0 | 0 | 0 | 0 | 0 | 1 | 1 | 0 | 0 | 0 | 0 | 0 | 0 | 0 | 1 | 1 | 0 |
| 99 | 262.06 | 0 | 0 | 0 | 0 | 0 | 1 | 1 | 0 | 0 | 0 | 0 | 0 | 0 | 0 | 0 | 1 | 1 |
| 100 | 264.71 | 0 | 0 | 0 | 0 | 0 | 1 | 1 | 0 | 0 | 0 | 0 | 0 | 0 | 0 | 0 | 1 | 0 |
| 101 | 267.35 | 0 | 0 | 0 | 0 | 0 | 1 | 1 | 0 | 0 | 0 | 0 | 0 | 0 | 0 | 0 | 0 | 1 |
| 102 | 270.00 | 0 | 0 | 0 | 0 | 0 | 0 | 1 | 1 | 0 | 0 | 0 | 0 | 0 | 0 | 0 | 0 | 0 |

TABLE 4

Control codes covering the range of 270 to 360 degrees.

| Step | Phase | C1 | C2 | C3 | C4 | C5 | C6 | C7 | C8 | F1 | F2 | F3 | F4 | F5 | F6 | F7 | F8 | F9 |
|---|---|---|---|---|---|---|---|---|---|---|---|---|---|---|---|---|---|---|
| 102 | 270.00 | 0 | 0 | 0 | 0 | 0 | 0 | 1 | 1 | 0 | 0 | 0 | 0 | 0 | 0 | 0 | 0 | 0 |
| 103 | 272.65 | 0 | 0 | 0 | 0 | 0 | 0 | 1 | 1 | 0 | 0 | 0 | 0 | 0 | 0 | 0 | 0 | 1 |
| 104 | 275.29 | 0 | 0 | 0 | 0 | 0 | 0 | 1 | 1 | 0 | 0 | 0 | 0 | 0 | 0 | 0 | 1 | 0 |
| 105 | 277.94 | 0 | 0 | 0 | 0 | 0 | 0 | 1 | 1 | 0 | 0 | 0 | 0 | 0 | 0 | 0 | 1 | 1 |
| 106 | 280.59 | 0 | 0 | 0 | 0 | 0 | 0 | 1 | 1 | 0 | 0 | 0 | 0 | 0 | 0 | 1 | 1 | 0 |
| 107 | 283.24 | 0 | 0 | 0 | 0 | 0 | 0 | 1 | 1 | 0 | 0 | 0 | 0 | 0 | 0 | 1 | 1 | 1 |
| 108 | 285.88 | 0 | 0 | 0 | 0 | 0 | 0 | 1 | 1 | 0 | 0 | 0 | 0 | 0 | 1 | 1 | 1 | 0 |
| 109 | 288.53 | 0 | 0 | 0 | 0 | 0 | 0 | 1 | 1 | 0 | 0 | 0 | 0 | 0 | 1 | 1 | 1 | 1 |
| 110 | 291.18 | 0 | 0 | 0 | 0 | 0 | 0 | 1 | 1 | 0 | 0 | 0 | 0 | 1 | 1 | 1 | 1 | 0 |
| 111 | 293.82 | 0 | 0 | 0 | 0 | 0 | 0 | 1 | 1 | 0 | 0 | 0 | 0 | 1 | 1 | 1 | 1 | 1 |
| 112 | 296.47 | 0 | 0 | 0 | 0 | 0 | 0 | 1 | 1 | 0 | 0 | 0 | 1 | 1 | 1 | 1 | 1 | 0 |
| 113 | 299.12 | 0 | 0 | 0 | 0 | 0 | 0 | 1 | 1 | 0 | 0 | 0 | 1 | 1 | 1 | 1 | 1 | 1 |
| 114 | 301.76 | 0 | 0 | 0 | 0 | 0 | 0 | 1 | 1 | 0 | 0 | 1 | 1 | 1 | 1 | 1 | 1 | 0 |
| 115 | 304.41 | 0 | 0 | 0 | 0 | 0 | 0 | 1 | 1 | 0 | 0 | 1 | 1 | 1 | 1 | 1 | 1 | 1 |
| 116 | 307.06 | 0 | 0 | 0 | 0 | 0 | 0 | 1 | 1 | 0 | 1 | 1 | 1 | 1 | 1 | 1 | 1 | 0 |
| 117 | 309.71 | 0 | 0 | 0 | 0 | 0 | 0 | 1 | 1 | 0 | 1 | 1 | 1 | 1 | 1 | 1 | 1 | 1 |
| 118 | 312.35 | 0 | 0 | 0 | 0 | 0 | 0 | 1 | 1 | 1 | 1 | 1 | 1 | 1 | 1 | 1 | 1 | 0 |
| 119 | 315.00 | 1 | 0 | 0 | 0 | 0 | 0 | 0 | 1 | 1 | 1 | 1 | 1 | 1 | 1 | 1 | 1 | 1 |
| 120 | 317.65 | 1 | 0 | 0 | 0 | 0 | 0 | 0 | 1 | 1 | 1 | 1 | 1 | 1 | 1 | 1 | 1 | 0 |
| 121 | 320.29 | 1 | 0 | 0 | 0 | 0 | 0 | 0 | 1 | 0 | 1 | 1 | 1 | 1 | 1 | 1 | 1 | 1 |
| 122 | 322.94 | 1 | 0 | 0 | 0 | 0 | 0 | 0 | 1 | 0 | 1 | 1 | 1 | 1 | 1 | 1 | 1 | 0 |
| 123 | 325.59 | 1 | 0 | 0 | 0 | 0 | 0 | 0 | 1 | 0 | 0 | 1 | 1 | 1 | 1 | 1 | 1 | 1 |
| 124 | 328.24 | 1 | 0 | 0 | 0 | 0 | 0 | 0 | 1 | 0 | 0 | 1 | 1 | 1 | 1 | 1 | 1 | 0 |
| 125 | 330.88 | 1 | 0 | 0 | 0 | 0 | 0 | 0 | 1 | 0 | 0 | 0 | 1 | 1 | 1 | 1 | 1 | 1 |
| 126 | 333.53 | 1 | 0 | 0 | 0 | 0 | 0 | 0 | 1 | 0 | 0 | 0 | 1 | 1 | 1 | 1 | 1 | 0 |
| 127 | 336.18 | 1 | 0 | 0 | 0 | 0 | 0 | 0 | 1 | 0 | 0 | 0 | 0 | 1 | 1 | 1 | 1 | 1 |
| 128 | 338.82 | 1 | 0 | 0 | 0 | 0 | 0 | 0 | 1 | 0 | 0 | 0 | 0 | 1 | 1 | 1 | 1 | 0 |
| 129 | 341.47 | 1 | 0 | 0 | 0 | 0 | 0 | 0 | 1 | 0 | 0 | 0 | 0 | 0 | 1 | 1 | 1 | 1 |
| 130 | 344.12 | 1 | 0 | 0 | 0 | 0 | 0 | 0 | 1 | 0 | 0 | 0 | 0 | 0 | 1 | 1 | 1 | 0 |
| 131 | 346.76 | 1 | 0 | 0 | 0 | 0 | 0 | 0 | 1 | 0 | 0 | 0 | 0 | 0 | 0 | 1 | 1 | 1 |

TABLE 4-continued

Control codes covering the range of 270 to 360 degrees.

| Step | Phase | C1 | C2 | C3 | C4 | C5 | C6 | C7 | C8 | F1 | F2 | F3 | F4 | F5 | F6 | F7 | F8 | F9 |
|---|---|---|---|---|---|---|---|---|---|---|---|---|---|---|---|---|---|---|
| 132 | 349.41 | 1 | 0 | 0 | 0 | 0 | 0 | 0 | 1 | 0 | 0 | 0 | 0 | 0 | 0 | 1 | 1 | 0 |
| 133 | 352.06 | 1 | 0 | 0 | 0 | 0 | 0 | 0 | 1 | 0 | 0 | 0 | 0 | 0 | 0 | 0 | 1 | 1 |
| 134 | 354.71 | 1 | 0 | 0 | 0 | 0 | 0 | 0 | 1 | 0 | 0 | 0 | 0 | 0 | 0 | 0 | 1 | 0 |
| 135 | 357.35 | 1 | 0 | 0 | 0 | 0 | 0 | 0 | 1 | 0 | 0 | 0 | 0 | 0 | 0 | 0 | 0 | 1 |
| 0 | 360.00 | 1 | 1 | 0 | 0 | 0 | 0 | 0 | 0 | 0 | 0 | 0 | 0 | 0 | 0 | 0 | 0 | 0 |

Note:
A phase shift of 360 degrees equals 0 degrees.

The following Figures show circuit configurations that may be used to implement functional blocks of the Interpolating Phase Detector Array 404 (see FIG. 5) as well as the voltage shifting circuit 406 (see FIG. 4) of the Multiphase Adjustable PLL 306.

Figure 8:
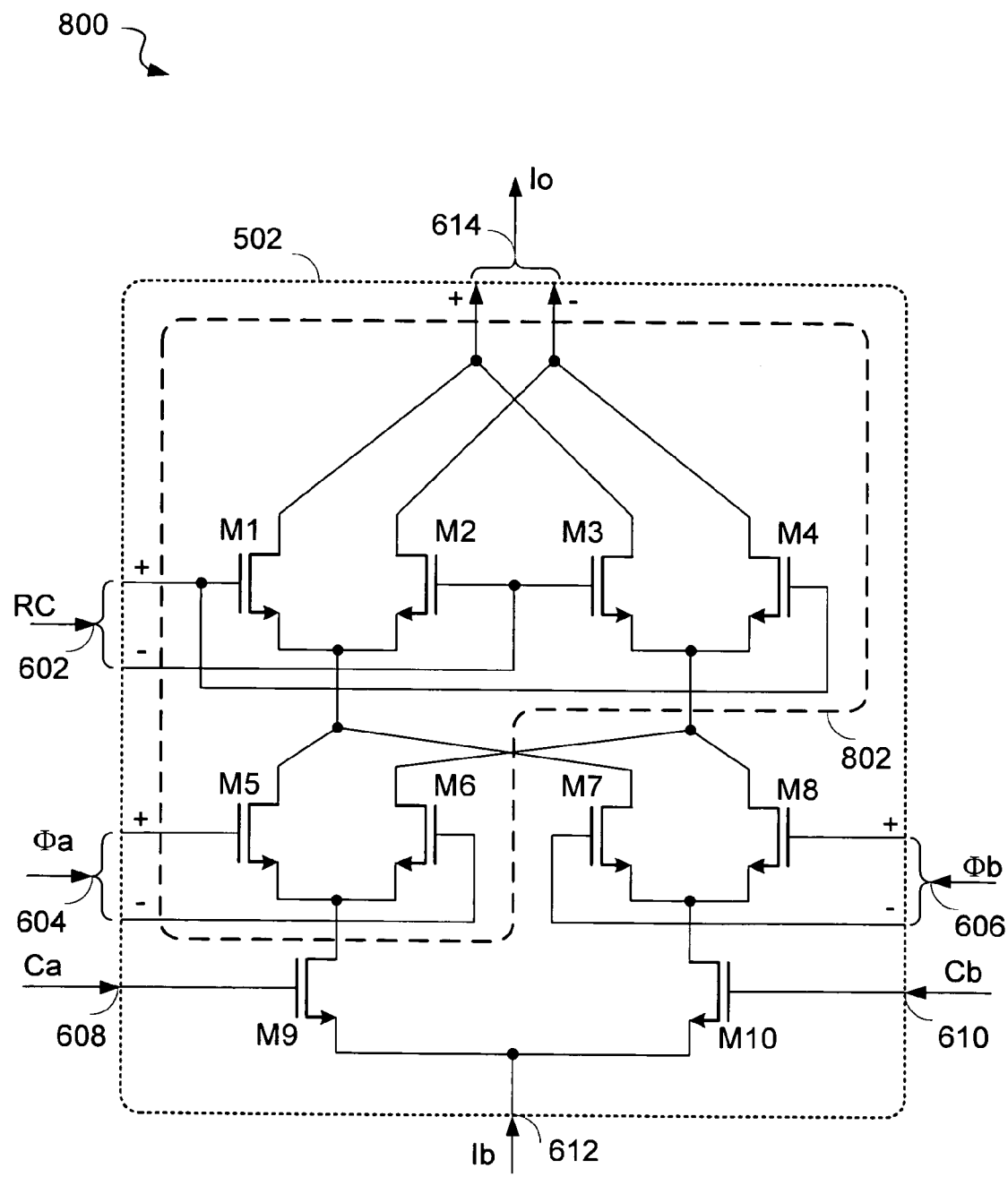
FIG. 8 shows a circuit implementation 800 of the XOR-block 502 of FIG. 5.

FIG. 8 shows a circuit implementation 800 of the XOR-block 502. The XOR-block 502 includes ten N-channel MOSFET transistors M1 to M10.

The sources of M1 and M2 are joined and connected to the joined drains of the transistors M5 and M7. The bases of M1 and M2 are connected to the positive and negative leads respectively of the differential reference clock (RC) input 602 of the XOR-block 502. The drains of M1 and M2 are connected to the positive and negative leads respectively of the differential phase error output 614 (Io) 614 of the XOR-block 502.

The sources of M3 and M4 are joined and connected to the joined drains of the transistors M6 and M8. The bases of M4 and M3 are connected in parallel with the bases of M1 and M2 respectively, and thus to the positive and negative leads respectively of the reference clock (RC) input 602 of the XOR-block 502. The drains of M3 and M4 are connected in parallel with the drains of M1 and M2 respectively, and thus to the positive and negative leads respectively of the differential phase error output 614 (Io) of the XOR-block 502.

The sources of M5 and M6 are joined and connected to the drain of the transistor M9. The bases of M5 and M6 are connected to the positive and negative leads respectively of the first phase shifted clock input 604 (Φa). Similarly, the sources of M7 and M8 are joined and connected to the drain of the transistor M10. The bases of M7 and M8 are connected to the positive and negative leads respectively of the second phase shifted clock input 606 (Φb).

The sources of M9 and M10 are joined and connected to the bias current input 612 (Ib). The base of M9 is connected to the first coarse control input 608 (Ca), and the base of M10 is connected to the second coarse control input 610 (Cb).

The entire circuit of the XOR-block 502 is idle when no bias current is supplied from the bias current input 612 (Ib). When bias current is supplied, this current may be steered through the transistor M9 if the first coarse control input 608 (Ca) is active, i.e. a logic "1" represented by a positive signal. Alternatively the bias current may be steered through the transistor M10 if the second coarse control input 610 (Cb) is active. External control logic must ensure that only one of Ca or Cb is active at the same time. If both Ca and Cb are inactive, no current flows through the XOR-block 502, even if bias current is available.

A first group of transistors M1 to M6 may be considered as a first differential XOR gate 802, if the bias current is provided and steered through M9 by virtue of Ca being activated. The first differential XOR gate 802 provides the XOR function between the reference clock signal at the reference clock input RC 602, and the clock signal at the first phase shifted clock input 604 (Φa). The result is a differential phase error signal at the differential phase error output 614 (Io). The bias current is alternatingly conducted by the differential XOR gate 802 into either the positive and negative leg of the differential phase error signal Io, with a duty cycle that is determined by the phase relationship between the reference clock (RC) and the first phase shifted clock input 604 (Φa) in a manner well known to practitioners of PLL design.

When the second coarse control input Cb is activated, the bias current is switched by M10 into a similar second differential XOR gate, defined by the group of transistors M1 to M4 and M7 and M8 (not explicitly outlined in FIG. 8). In this case the differential phase error signal Io results from the XOR function being applied to the reference clock input RC and the second phase shifted clock input 606 (Φb).

Figure 9:
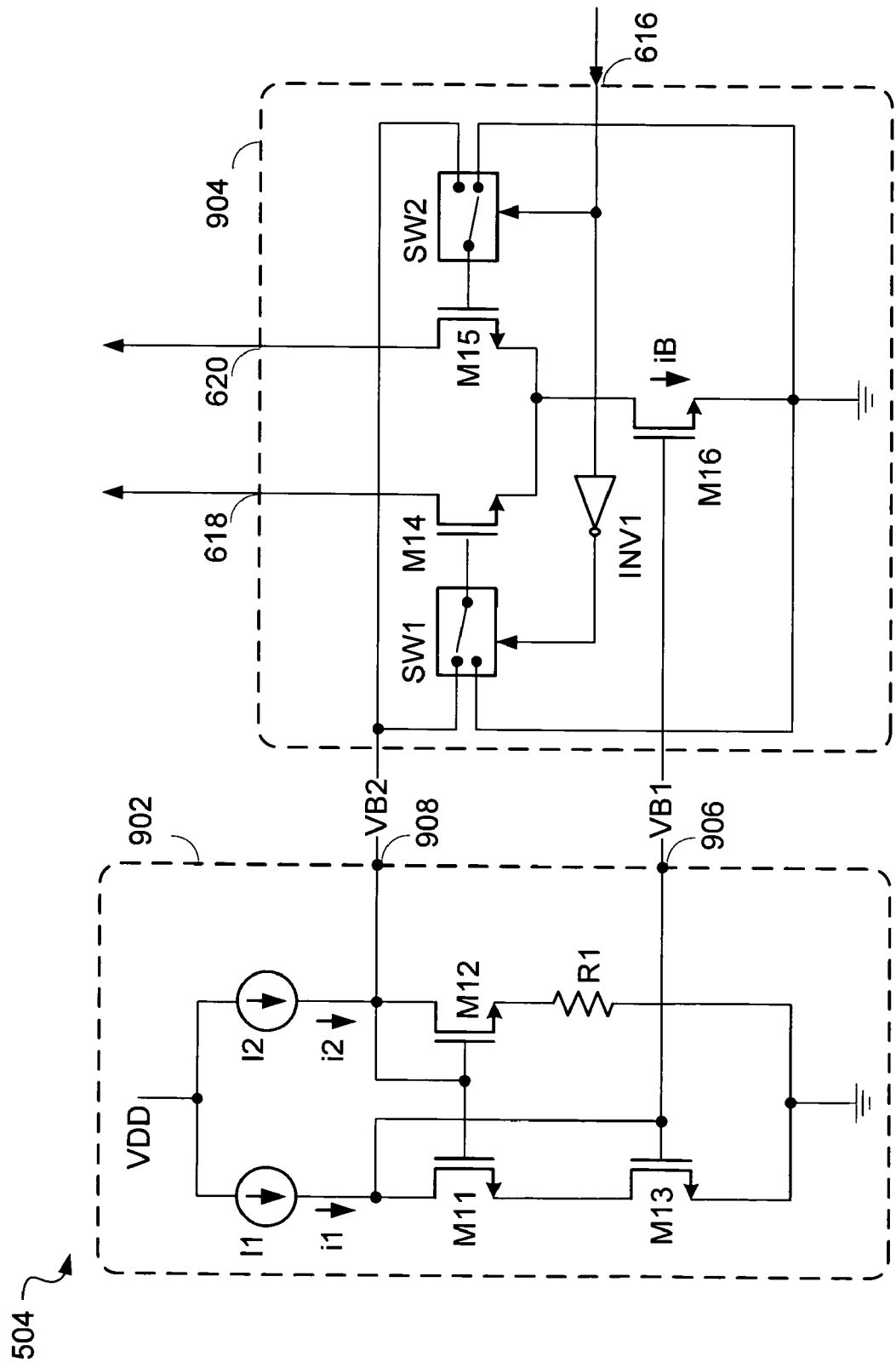
FIG. 9 shows a circuit implementation of the steerable current source 504 of FIG. 5, including an optional bias generator 902 and a current source block 904.

The XOR-block 502 thus provides a phase comparison between the reference clock signal and either the first or the second phase shifted clock input (Φa or Φb respectively) depending on the state of the corresponding coarse control inputs Ca and Cb. If neither Ca nor Cb are active, the XOR-block 502 remains inactive (passive). Regardless of the states of the coarse control inputs Ca and Cb, the XOR-block 502 also remains inactive (passive) if no bias current (Ib) is supplied. FIG. 9 shows a circuit implementation of the steerable current source 504, including an optional bias generator 902 and a current source block 904. The bias generator 902 may be used to provide bias voltages VB1 and VB2 within each steerable current source 504. In the preferred embodiment of the invention however, a single bias generator 902 provides the bias voltages VB1 and VB2 to all N steerable current sources 504.

The bias generator 902 comprises two current sources I1 and I2; three N-channel MOSFET transistors M11, M12, and M13; and a resistor R1. The current source I1 is connected between a supply voltage VDD and the drain of the transistor M11, the source of M11 is connected to the drain of the transistor M13, and the source of M13 is connected to ground. The current source I2 is connected between the supply voltage VDD and the drain of the transistor M12, and the source of M12 is connected to ground through the resistor R1. The drain of M11 is further connected to the base of M13, and to an output 906 of the bias generator 902 outputting the bias voltage VB1. The drain of M12 is further connected to the bases of both, the transistors M11 and M12, as well as to an output 908 of the bias generator 902 outputting the bias voltage VB2.

The bias generator 902 generates the bias voltage VB2 by passing the current determined by the current source I2 (a current i2) through the series combination of the diode-connected transistor M12 and the resistor R1. The bias voltage VB2 is thus determined by the voltage drop of the current i2 through R1 plus the drain-source voltage drop through M12 which acts as a diode (base tied to drain).

A current of magnitude i1, determined by the current source I1, flows though a cascaded pair consisting of the transistors M11 and M13. The (negative feedback) connection from the drain of M11 to the base of M13 stabilizes the operating point of M13, while M11 is biased by VB2 so as to not saturate M13.

The current source block 904 includes two MOSFET transistors M14, M15, and M16; two 2-way switches SW1 and SW2; and a logic inverter INV1.

The base of the transistor M16 is connected to the bias voltage VB1, and its source is connected to ground. The drain of the transistor M16 is connected to the sources of both, the transistors M14 and M15 whose drains are connected to the first and second current sink outputs 618 and 620 respectively. M16 functions as a current source of a current iB, mirroring the current i1 that flows through M13, by drawing a current that is equal to i1 if both M13 and M16 are of equal size, or equal to i1 multiplied by a factor that is dependent on the relative sizes of M13 and M16. The bases of M14 and M15 are connected through the switches SW1 and SW2 respectively, to either VB2 or ground, depending on the state of the switches. The switches SW1 and SW2 have control inputs that are driven by logic signals, SW2 being directly connected to the current steering input 616, and SW1 being driven by the output of the logic inverter INV1 whose input is tied to the current steering input 616. When the value of the current steering input 616 (ultimately the value of a specific fine control signal Fx, x=1 to N) is "0", the switch SW1 connects the base of M14 to the bias voltage VB2, which turns M14 on, providing a path for the bias current iB from the first current sink output 618 to pass through M14 and M16 to ground, while at the same time, the switch SW2 connects the base of M15 to ground thus turning M15 off and allowing no current to flow into the second current sink output 620. When the value of the current steering input 616 is "1", the reverse situation obtains: the switch SW2 connects the base of M15 to the bias voltage VB2, which turns M15 on, allowing the bias current iB to pass from the second current sink output 620 through M15 and M16 to ground, while at the same time, the switch SW1 connects the base of M14 to ground thus turning M14 off and allowing no current to flow into the first current sink output 620.

By sharing the bias generator 902 for all steerable current sources 504 it is conveniently achieved that they provide the same amount of bias current iB (i.e. one unit). It is also convenient to design one of the steerable current sources 504 to provide a half unit of bias current by reducing the size of the corresponding transistor M16 accordingly.

Figure 10:
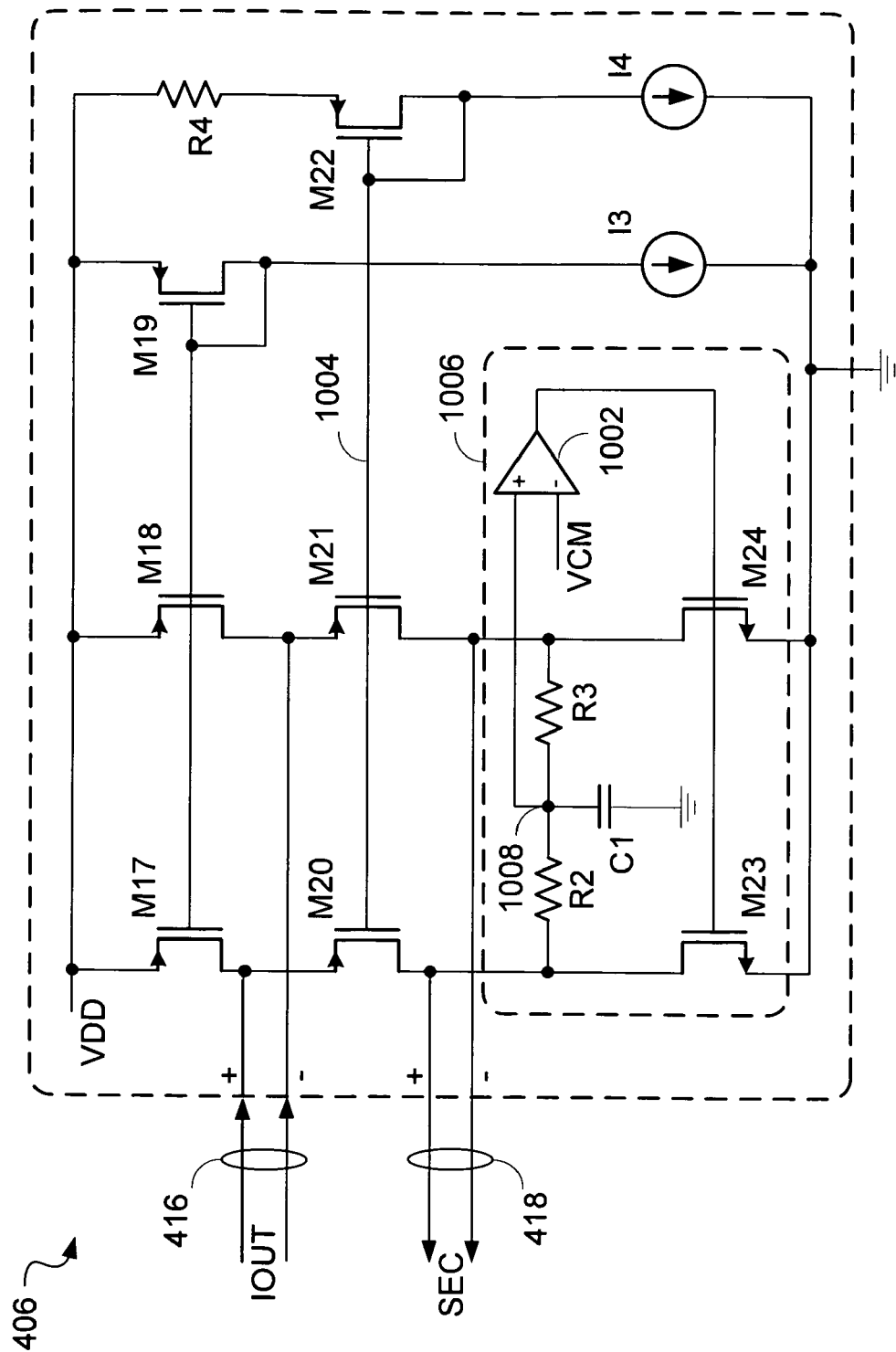
FIG. 10 shows a circuit implementation of the voltage shifting circuit (VSC) 406 of FIG. 4.

FIG. 10 shows a circuit implementation of the voltage shifting circuit 406. The voltage shifting circuit (VSC) 406 may be implemented as a differential folded cascade stage using a combination of P-channel and N-channel MOSFET transistors.

The VSC 406 comprises six P-channel MOSFET transistors M17 to M22, and two N-channel MOSFET transistors M23 and M24. The VSC 406 further comprises two current sources I3 and I4; three resistors R2, R3, and R4; a capacitor C1; and a differential amplifier 1002. The sources of the transistors M17, M18, and M19 are tied to the supply voltage VDD. The transistor M19 is connected in diode configuration (base tied to drain) in series with the current source I3 to ground. The bases of all three of M17, M18, and M19 are tied together, thus the current generated by I3 is mirrored to M17 and M18, and may be scaled by choosing different device sizes, as described earlier (in connection with the bias generator 902). The drains of M17 and M18 are connected to the positive and negative leads respectively of the current input 416 (see FIG. 4), and M17 and M18 thus provide a constant current load to the differential phase error current IOUT. The drains of M17 and M18 are also connected to the sources of the transistors M20 and M21 respectively. The bases of M20 and M21 are tied together and tied to a bias node 1004. The voltage at the bias node 1004 is generated by the combination of the resistor R4, the diode-connected transistor M22, and the current source I4. R4 is connected between the supply voltage VDD and the source of M22. The current source I4 is connected between ground and the drain of M22 (tied to the base), which is also the bias node 1004. The drains of M20 and M21 are connected to the positive and negative leads respectively of the shifted error current output 418 of the VSC 406 which provides the shifted error current SEC.

For SEC to be directly usable (via the loop filter 408) to drive the frequency control input 410 of the Multiphase VCO 402 (see FIG. 4), the common mode voltage of SEC needs to be set to an appropriate value. This is achieved by providing the drains of M20 and M21 with a load circuit 1006 which includes the elements M23, M24, R2, R3, C1, and the differential amplifier 1002. The drain of the P-channel MOSFET transistor M20 is further connected to the drain of the N-channel MOSFET transistor M23 and one end of the resistor R2. Similarly, the drain of M21 is further connected to the drain of M24 and one end of the resistor R3. The other ends of R2 and R3 are connected to a virtual supply voltage node 1008. The virtual supply voltage node 1008 is connected to ground through the capacitor C1, and to the positive input of the differential amplifier 1002. The negative input of the differential amplifier 1002 is connected to a common mode bias voltage VCM. The output of the differential amplifier 1002 drives the bases of M23 and M24 whose sources are tied to ground. The resistors R2 and R3, together with the capacitor C1 form a simple low pass filter for averaging the common mode voltage of SEC. The voltage at the virtual supply voltage node 1008 is compared with VCM by the differential amplifier 1002 whose output drives the bases of M23 and M24 until the voltage difference between the virtual supply voltage node 1008 and VCM is substantially zero.

The constant currents driven by the current mirror transistors M17 and M18 should be higher than the highest value of either polarity of the differential phase error current IOUT may attain. At any moment the excess currents from M17 and M18 are deflected into M20 and M21, and finally M23 and M24. Because the differential amplifier 1002 holds the average currents in M23 and M24 constant and equal, current variations from the differential phase error current IOUT are passed through M20 and M21 and thence to the shifted error current output 418.

The Interpolating Phase Detector Array 404 overcomes several disadvantages of the prior art, by providing inherently good linearity while reducing power consumption significantly. The lower power consumption is achieved by taking advantage of a matrix circuit configuration in which the active elements (the active XOR-blocks 502 and the steerable current sources 504 may all be designed with the lowest power compatible with the desired speed to operate at a single current level. This enables the implementation of an advanced memory buffer (AMB) with significant lower power without requiring a technology level exceeding that generally used.

Numerous modifications and variations of the present invention are possible in light of the above teachings. It is therefore to be understood that within the scope of the given system characteristics, the invention may be practiced otherwise than as specifically described herein.

Although specific embodiments of the invention have been described in detail, it will be apparent to one skilled in the art that variations and modifications to the embodiments may be made within the scope of the following claims.

What is claimed is:

1. An interpolating phase detector array for comparing a phase of a reference clock signal with phases of a set of K phase shifted clock signals and generating a phase error output signal, the interpolating phase detector array comprising:
   a plurality of N phase detector columns, each column including:
      a plurality of M exclusive-OR (XOR) blocks, each block having:
         inputs for receiving the reference clock signal, receiving two of the phase shifted clock signals, receiving "coarse" control signals for enabling said received phase shifted clock signals; and
         a phase error output;
      a steerable current source having first and second current sink outputs for delivering a bias current to two distinct sets of XOR blocks, and having an input to receive a "fine" control signal for directing the bias current to one of said distinct sets; and
      a current output IOUT for delivering the phase error output signal formed by joining phase error outputs of the plurality of M XOR blocks;
   wherein M and N are natural numbers, which are equal or greater than 2, and K=2M.

2. The interpolating phase detector array as described in claim 1, wherein the received phase shifted clock signals are selected from the set of K phase shifted clock signals to have phases differing by 180 degrees.

3. The interpolating phase detector array as described in claim 1, wherein each of the received phase shifted clock signals is connected to one of the XOR-blocks in each phase detector column.

4. The interpolating phase detector array as described in claim 1, wherein all N steerable current sources are designed to deliver substantially the same unit strength of the bias current.

5. The interpolating phase detector array as described in claim 1, wherein N−1 steerable current sources are designed to deliver substantially the same unit strength of the bias current, and one steerable current source is designed to deliver the bias current with a strength of ½ unit.

6. The interpolating phase detector array as described in claim 1, wherein M=4 and K=8.

7. The interpolating phase detector array as described in claim 1, wherein N=9.

8. An interpolating phase detector array for comparing a phase of a reference clock signal with phases of a set of K phase shifted clock signals and generating a phase error output signal, the phase detector array comprising:
   a matrix of M rows by N columns of exclusive-OR (XOR) blocks, and a set of N steerable current sources;
   each of the XOR blocks including a reference clock input connected to the reference clock signal, further including first and second phase shifted clock inputs connected to selected ones of the set of phase shifted clock signals, a bias current input, and a phase error output, the phase error outputs of all XOR blocks being joined into a current output IOUT for delivering the phase error output signal; and
   each of the N steerable current sources being assigned to a distinct one of the columns of the XOR-blocks, each steerable current source including a first current sink output connected to the bias current inputs of the XOR-blocks of odd-numbered rows, and second current sink outputs connected to the bias current inputs of the XOR-blocks of even-numbered rows;
   wherein M and N are natural numbers, which are equal or greater than 2, and K=2M.

9. The interpolating phase detector array as described in claim 8, wherein each XOR block further includes first and second "coarse" control inputs for enabling corresponding first and second phase shifted clock inputs, and wherein each steerable current source further includes a "fine" control input for steering the bias current to either the first or second current sink outputs.

10. The interpolating phase detector array as described in claim 8, wherein all N steerable current sources are designed to deliver substantially the same unit strength of the bias current.

11. The interpolating phase detector array as described in claim 8, wherein N−1 steerable current sources are designed to deliver substantially the same unit strength of the bias current, and one steerable current source is designed to deliver the bias current with a strength of ½ unit.

12. The interpolating phase detector array as described in claim 8, wherein M=4 and K=8.

13. The interpolating phase detector array as described in claim 8, wherein N=9.

14. A method for detecting a phase error in an interpolating phase detector array, comprising:
   providing an array of XOR blocks arranged in M rows and N columns for comparing a phase of a reference clock signal with phases of a set of K phase shifted clock signals, wherein M and N are natural numbers, which are equal or greater than 2, and K=2M;
   enabling a first subset of the XOR blocks in one of the M rows to perform the comparison with the phase of a first one of the K phase shifted clock signals, under control of a first "coarse" control signal;
   enabling a second subset of the XOR blocks in a different one of the M rows to perform the comparison with the phase of a second one of the K phase shifted clock signals, under control of a second "coarse" control signal, the phase of the second phase shifted clock signal differing from the phase of the first phase shifted clock signal by approximately 360/K degrees;
   providing each enabled XOR block with a bias current of unit strength; and
   generating a phase error output signal by combining comparison outputs from all enabled XOR blocks.

15. The method for detecting a phase error of claim 14, wherein providing each enabled XOR block with a bias current includes steering the bias current from one of N steerable current sources individually assigned to a column to XOR blocks in the column in odd-numbered and even-numbered rows respectively, dependent on the state of a "fine" control signal applied to the steerable current source.

16. The method for detecting a phase error of claim 15, further comprising the step of selecting a combination of states of the N "fine" control signals to steer the bias current to a first and second subsets of the XOR blocks in the odd-numbered and even-numbered rows respectively.

17. The method for detecting a phase error of claim 16, further comprising the step of combining the phase error outputs from the enabled XOR blocks of the each subset yielding a combined phase error output current of a strength in proportion to a size of the respective subset.

18. The method for detecting a phase error of claim 15, wherein M=4, K=8, and N=9.

19. A phase lock loop (PLL) including a multiphase voltage controlled oscillator (VCO) generating a set of K phase shifted clock signals whose frequency is controlled through a frequency control input, and an interpolating phase detector array designed for comparing a phase of a reference clock signal with phases of the phase shifted clock signals and for generating a phase error output signal, the interpolating phase detector array comprising:

a plurality of N phase detector columns, each phase detector column including:

a plurality of M exclusive-OR (XOR) blocks, each having inputs for receiving the reference clock signal, receiving two of the phase shifted clock signals, receiving "coarse" control signals for enabling said received phase shifted clock signals, and having a phase error output; and a steerable current source having first and second current sink outputs for delivering a bias current to two distinct sets of XOR blocks, and having an input to receive a "fine" control signal for directing the bias current to one of said distinct sets; and the phase error outputs of all XOR blocks being joined into a current output IOUT for delivering the phase error output signal;

wherein M and N are natural numbers, which are equal or greater than 2, and K=2M.

20. The PLL as described in claim 19 further including a current to voltage converter coupled to the current output IOUT, for converting the phase error output current IOUT into a voltage phase error voltage SEC coupled to the frequency control input of the VCO.

21. The PLL as described in claim 19, wherein each of the received phase shifted clock signals is connected to one of the XOR blocks in each phase detector column.

22. The PLL as described in claim 19, wherein all N steerable current sources are designed to deliver substantially the same unit strength of the bias current.

23. The PLL as described in claim 19 wherein N−1 steerable current sources are designed to deliver substantially the same unit strength of the bias current, and one steerable current source is designed to deliver the bias current with a strength of ½ unit.

24. The PLL as described in claim 19, wherein M=4 and K=8.

25. The PLL as described in claim 19, wherein N=9.

* * * * *